United States Patent
Havens et al.

(10) Patent No.: US 7,219,843 B2
(45) Date of Patent: May 22, 2007

(54) OPTICAL READER HAVING A PLURALITY OF IMAGING MODULES

(75) Inventors: William H. Havens, Marcellus, NY (US); Charles P. Barber, Fayetteville, NY (US); Colleen Gannon, Jordan, NY (US); Robert C. Gardiner, Fayetteville, NY (US); Robert J. Hennick, Auburn, NY (US); John A. Pettinelli, Camillus, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 63 days.

(21) Appl. No.: 10/453,796

(22) Filed: Jun. 3, 2003

(65) Prior Publication Data

US 2004/0020990 A1 Feb. 5, 2004

Related U.S. Application Data

(63) Continuation-in-part of application No. 10/440,729, filed on May 19, 2003, which is a continuation-in-part of application No. 10/252,484, filed on Sep. 23, 2002, and a continuation-in-part of application No. 10/161,950, filed on Jun. 4, 2002, now abandoned.

(60) Provisional application No. 60/387,842, filed on Jun. 11, 2002.

(51) Int. Cl.
*G06K 7/10* (2006.01)

(52) U.S. Cl. .............................. 235/462.42; 235/462.41

(58) Field of Classification Search ................. 235/454, 235/472.01, 462.1, 462.11, 462.12, 462.2, 235/462.21, 462.23, 462.24, 462.32, 462.33, 235/462.41, 462.42, 462.45, 472; 382/312–324
See application file for complete search history.

(56) References Cited

U.S. PATENT DOCUMENTS 3,978,317 A 8/1976 Yamaguchi et al.

(Continued)

FOREIGN PATENT DOCUMENTS

DE 12 33 038 B 1/1967

(Continued)

OTHER PUBLICATIONS

International Search Report for Application No. PCT/US03/17564 dated Sep. 18, 2003.

(Continued)

*Primary Examiner*—Thien M. Lee
*Assistant Examiner*—Kumiko C. Koyama
(74) *Attorney, Agent, or Firm*—Wall Marjama & Bilinski LLP

(57) ABSTRACT

The invention is an optical reader having a plurality of image sensors. Each image sensor of a plural image sensor optical reader can be disposed on an imaging module that can include a light source. In one embodiment, a frame of image data captured via actuation of an image sensor of a first imaging module and actuation of illumination of a second imaging module is subjected to decoding. The various modules of a multiple imaging module reader can be adapted to have different best focus positions so that a field depth of the reader is improved.

65 Claims, 20 Drawing Sheets

U.S. PATENT DOCUMENTS

| | | | |
|---|---|---|---|
| RE29,194 E * | 4/1977 | Ambrose et al. ............. 355/43 |
| 4,057,784 A | 11/1977 | Tafoya |
| 4,085,423 A | 4/1978 | Tsunoda et al. |
| 4,542,528 A | 9/1985 | Sanner et al. |
| 4,721,849 A | 1/1988 | Davis et al. |
| 4,758,717 A | 7/1988 | Shepard et al. |
| 4,760,248 A | 7/1988 | Swartz et al. |
| 4,774,715 A | 9/1988 | Messenger |
| 4,818,847 A | 4/1989 | Hara et al. |
| 4,841,132 A | 6/1989 | Kajitani et al. |
| 4,847,490 A | 7/1989 | Nishikama |
| 4,866,257 A | 9/1989 | Elliott et al. |
| 4,877,949 A | 10/1989 | Danielson et al. |
| 4,900,907 A | 2/1990 | Matusima et al. |
| 4,918,297 A | 4/1990 | Kurimoto |
| 4,920,255 A | 4/1990 | Gabeler |
| 4,945,216 A | 7/1990 | Tanabe et al. |
| 4,964,167 A | 10/1990 | Kunizawa et al. |
| 5,010,241 A | 4/1991 | Butterworth |
| 5,019,699 A | 5/1991 | Koenck |
| 5,034,619 A | 7/1991 | Hammond, Jr. |
| 5,046,066 A | 9/1991 | Messenger |
| 5,059,778 A | 10/1991 | Zouzoulas et al. |
| 5,059,779 A | 10/1991 | Krichever |
| 5,101,406 A | 3/1992 | Messenger |
| 5,132,525 A | 7/1992 | Swartz |
| 5,149,948 A | 9/1992 | Chisholm |
| 5,157,248 A | 10/1992 | Barkan |
| 5,177,346 A | 1/1993 | Chisholm |
| 5,206,881 A | 4/1993 | Messenger et al. |
| 5,208,449 A | 5/1993 | Eastman et al. |
| 5,233,171 A | 8/1993 | Baldwin |
| 5,235,167 A | 8/1993 | Dvorkis et al. |
| 5,280,161 A | 1/1994 | Niwa |
| 5,280,164 A | 1/1994 | Barkan |
| 5,286,960 A | 2/1994 | Longacre, Jr. et al. |
| 5,291,008 A | 3/1994 | Havens et al. |
| 5,294,783 A | 3/1994 | Hammond, Jr. et al. |
| 5,296,689 A | 3/1994 | Redderson et al. |
| 5,308,962 A | 5/1994 | Havens et al. |
| 5,317,136 A | 5/1994 | Hasegawa et al. |
| 5,319,182 A | 6/1994 | Havens et al. |
| 5,331,176 A | 7/1994 | Sant Anselmo |
| 5,340,971 A | 8/1994 | Rockstein et al. |
| 5,340,972 A * | 8/1994 | Sandor ................. 235/462.44 |
| 5,347,113 A | 9/1994 | Redderson et al. |
| 5,347,114 A | 9/1994 | Tanaka |
| 5,354,977 A | 10/1994 | Roustaei |
| 5,378,883 A | 1/1995 | Batterman et al. |
| 5,389,917 A | 2/1995 | LaManna et al. |
| 5,396,054 A | 3/1995 | Krichever et al. |
| 5,404,002 A | 4/1995 | Tang |
| 5,406,063 A | 4/1995 | Jelen |
| 5,410,141 A | 4/1995 | Koenck et al. |
| 5,420,411 A | 5/1995 | Salatto, Jr. et al. |
| 5,430,286 A | 7/1995 | Hammond, Jr. et al. |
| 5,440,111 A | 8/1995 | Eastman et al. |
| 5,449,892 A | 9/1995 | Yamada |
| 5,473,149 A | 12/1995 | Miwa et al. |
| 5,504,316 A | 4/1996 | Bridgelall |
| 5,504,317 A | 4/1996 | Takahashi |
| 5,504,367 A | 4/1996 | Arackellian et al. |
| 5,510,606 A | 4/1996 | Worthington et al. |
| 5,532,692 A | 7/1996 | Tatsuya |
| 5,534,684 A | 7/1996 | Danielson |
| 5,541,419 A | 7/1996 | Arackellian |
| 5,550,364 A | 8/1996 | Rudeen |
| 5,550,367 A | 8/1996 | Plesko |
| 5,557,095 A | 9/1996 | Clark et al. |
| 5,576,529 A | 11/1996 | Koenck et al. |
| 5,579,487 A | 11/1996 | Meyerson et al. |
| 5,585,616 A | 12/1996 | Roxby |
| 5,591,955 A | 1/1997 | Laser |
| 5,597,997 A | 1/1997 | Obata et al. |
| 5,598,007 A | 1/1997 | Bunce et al. |
| 5,602,376 A | 2/1997 | Coleman et al. |
| 5,610,595 A | 3/1997 | Garrabrant et al. |
| 5,612,530 A | 3/1997 | Sanders et al. |
| 5,623,137 A | 4/1997 | Powers et al. |
| 5,637,854 A | 6/1997 | Thomas |
| 5,638,115 A * | 6/1997 | Imai ........................... 348/98 |
| 5,640,001 A | 6/1997 | Danielson et al. |
| 5,640,684 A | 6/1997 | Konosu et al. |
| 5,644,601 A | 7/1997 | Kawaguchi |
| 5,646,389 A | 7/1997 | Bravman et al. |
| 5,648,650 A | 7/1997 | Sugifune et al. |
| 5,659,778 A | 8/1997 | Gingold et al. |
| 5,668,803 A | 9/1997 | Tymes et al. |
| 5,672,858 A | 9/1997 | Li et al. |
| 5,684,104 A | 11/1997 | Funk et al. |
| 5,684,290 A | 11/1997 | Arackellian et al. |
| 5,696,607 A | 12/1997 | Yamana et al. |
| 5,697,699 A | 12/1997 | Seo et al. |
| 5,703,349 A | 12/1997 | Meyerson et al. |
| 5,714,745 A | 2/1998 | Ju et al. |
| 5,714,746 A | 2/1998 | Dvorkis et al. |
| 5,717,195 A | 2/1998 | Feng et al. |
| 5,717,221 A | 2/1998 | Li et al. |
| 5,723,868 A | 3/1998 | Hammond, Jr. et al. |
| 5,734,153 A | 3/1998 | Swartz et al. |
| 5,736,726 A | 4/1998 | VanHorn et al. |
| 5,739,518 A | 4/1998 | Wang |
| 5,743,633 A | 4/1998 | Chau et al. |
| 5,744,788 A | 4/1998 | Metlitsky et al. |
| 5,744,815 A | 4/1998 | Gurevich et al. |
| 5,745,176 A | 4/1998 | Lebens |
| 5,754,587 A | 5/1998 | Kawaguchi |
| 5,756,981 A | 5/1998 | Roustaei et al. |
| 5,763,864 A | 6/1998 | OHagan et al. |
| 5,773,810 A * | 6/1998 | Hussey et al. ......... 235/462.25 |
| 5,777,743 A | 7/1998 | Bacchi et al. |
| 5,780,831 A | 7/1998 | Seo et al. |
| 5,780,834 A | 7/1998 | Havens et al. |
| 5,783,811 A | 7/1998 | Feng et al. |
| 5,784,102 A | 7/1998 | Hussey et al. |
| 5,786,586 A | 7/1998 | Pidhirny et al. |
| 5,793,903 A | 8/1998 | Lopresti et al. |
| 5,794,145 A | 8/1998 | Milam |
| 5,801,371 A | 9/1998 | Kahn et al. |
| 5,802,179 A | 9/1998 | Yamamoto |
| 5,804,802 A | 9/1998 | Card et al. |
| 5,804,809 A | 9/1998 | Eastman et al. |
| 5,811,784 A | 9/1998 | Tausch et al. |
| 5,814,827 A | 9/1998 | Katz |
| 5,815,811 A | 9/1998 | Pinard et al. |
| 5,818,528 A | 10/1998 | Roth et al. |
| 5,821,518 A | 10/1998 | Sussmeier et al. |
| 5,825,006 A | 10/1998 | Longacre, Jr. et al. |
| 5,831,254 A | 11/1998 | Karpen et al. |
| 5,834,749 A | 11/1998 | Durbin |
| 5,834,754 A | 11/1998 | Feng et al. |
| 5,837,986 A | 11/1998 | Barile et al. |
| 5,838,720 A | 11/1998 | Morelli |
| 5,841,121 A | 11/1998 | Koenck |
| 5,848,064 A | 12/1998 | Cowan |
| 5,850,078 A | 12/1998 | Giordano et al. |
| 5,859,417 A | 1/1999 | Dvorkis et al. |
| 5,859,970 A | 1/1999 | Pleso |
| 5,872,354 A | 2/1999 | Hanson |
| 5,877,487 A | 3/1999 | Tani et al. |
| 5,880,452 A * | 3/1999 | Plesko ................... 235/472.01 |

| | | |
|---|---|---|
| 5,886,338 A | 3/1999 | Arackellian et al. |
| 5,894,348 A | 4/1999 | Bacchi et al. |
| 5,905,251 A | 5/1999 | Knowles |
| 5,912,921 A | 6/1999 | Warren et al. |
| 5,914,478 A | 6/1999 | Bridgelall |
| 5,920,061 A * | 7/1999 | Feng .................... 235/472.01 |
| 5,924,040 A | 7/1999 | Trompower |
| 5,929,418 A | 7/1999 | Ehrhart et al. |
| 5,932,139 A | 8/1999 | Oshima et al. |
| 5,932,862 A | 8/1999 | Hussey et al. |
| 5,942,741 A | 8/1999 | Longacre, Jr. et al. |
| 5,942,762 A | 8/1999 | Hecht |
| 5,945,660 A | 8/1999 | Nakasuji et al. |
| 5,946,344 A | 8/1999 | Warren et al. |
| 5,949,052 A | 9/1999 | Longacre, Jr. et al. |
| 5,949,054 A | 9/1999 | Karpen et al. |
| 5,949,056 A | 9/1999 | White |
| 5,949,057 A | 9/1999 | Feng |
| 5,955,720 A | 9/1999 | He et al. |
| 5,962,836 A | 10/1999 | Tani et al. |
| 5,965,863 A | 10/1999 | Parker et al. |
| 5,973,681 A | 10/1999 | Tanigawa et al. |
| 5,975,419 A | 11/1999 | Dickson et al. |
| 5,984,188 A * | 11/1999 | Dvorkis et al. ........ 235/472.01 |
| 5,988,506 A * | 11/1999 | Schaham et al. ........ 235/462.1 |
| 5,992,744 A * | 11/1999 | Smith et al. ........... 235/462.11 |
| 5,992,746 A | 11/1999 | Suzuki |
| 6,015,088 A | 1/2000 | Parker et al. |
| 6,178,426 B1 | 1/2000 | Klein et al. |
| 6,019,286 A | 2/2000 | Li et al. |
| 6,027,024 A | 2/2000 | Knowles |
| 6,029,893 A | 2/2000 | Tan et al. |
| 6,034,379 A | 3/2000 | Bunte et al. |
| 6,036,096 A | 3/2000 | Evers et al. |
| 6,039,255 A | 3/2000 | Seo |
| 6,045,047 A | 4/2000 | Pidhirny et al. |
| 6,045,048 A | 4/2000 | Wilz, Sr. et al. |
| 6,052,236 A | 4/2000 | Nakasuji et al. |
| 6,053,408 A * | 4/2000 | Stoner .................... 235/462.22 |
| 6,060,722 A | 5/2000 | Havens et al. |
| 6,062,475 A | 5/2000 | Feng |
| 6,066,857 A | 5/2000 | Fantone et al. |
| 6,068,188 A | 5/2000 | Knowles |
| 6,072,401 A | 6/2000 | Kumar |
| 6,092,728 A | 7/2000 | Li et al. |
| 6,098,887 A | 8/2000 | Figarella et al. |
| 6,119,939 A | 9/2000 | Schwartz et al. |
| 6,119,944 A | 9/2000 | Mulla et al. |
| 6,123,261 A | 9/2000 | Roustaei |
| 6,123,263 A * | 9/2000 | Feng .................... 235/462.42 |
| 6,123,264 A | 9/2000 | Li et al. |
| 6,129,283 A | 10/2000 | Imade et al. |
| 6,141,046 A | 10/2000 | Roth et al. |
| 6,147,358 A | 11/2000 | Hecht |
| 6,152,371 A | 11/2000 | Schwartz et al. |
| 6,155,491 A | 12/2000 | Dueker et al. |
| 6,164,544 A | 12/2000 | Schwartz et al. |
| 6,164,546 A | 12/2000 | Kumagai et al. |
| 6,179,208 B1 * | 1/2001 | Feng .................... 235/472.01 |
| 6,182,897 B1 | 2/2001 | Knowles et al. |
| 6,188,404 B1 | 2/2001 | Rekimoto |
| 6,199,044 B1 | 3/2001 | Ackley et al. |
| 6,213,397 B1 | 4/2001 | Rando |
| 6,223,988 B1 | 5/2001 | Batterman et al. |
| 6,283,374 B1 | 9/2001 | Fantone et al. |
| 6,298,176 B2 | 10/2001 | Longacre, Jr. et al. |
| 6,303,929 B1 | 10/2001 | Oshima et al. |
| 6,318,635 B1 | 11/2001 | Stoner |
| 6,318,637 B1 | 11/2001 | Stoner |
| 6,321,989 B1 | 11/2001 | Wilz, Sr. et al. |
| 6,321,991 B1 | 11/2001 | Knowles |
| 6,321,992 B1 | 11/2001 | Knowles et al. |
| 6,323,503 B1 | 11/2001 | Hecht |
| 6,325,289 B1 * | 12/2001 | Mazzone ............... 235/462.14 |
| 6,330,973 B1 | 12/2001 | Bridgelall et al. |
| 6,340,114 B1 * | 1/2002 | Correa et al. .......... 235/462.22 |
| 6,345,764 B1 | 2/2002 | Knowles |
| 6,347,163 B2 | 2/2002 | Roustaei |
| 6,347,743 B2 | 2/2002 | Wilz, Sr. et al. |
| 6,352,204 B2 | 3/2002 | Hattersley et al. |
| 6,352,517 B1 * | 3/2002 | Flock et al. ................. 600/595 |
| 6,360,949 B1 | 3/2002 | Shepard et al. |
| 6,371,374 B1 | 4/2002 | Schwartz et al. |
| 6,375,074 B1 | 4/2002 | Dickson et al. |
| 6,389,010 B1 | 5/2002 | Kubler et al. |
| 6,398,112 B1 | 6/2002 | Li et al. |
| 6,412,699 B1 | 7/2002 | Russell et al. |
| 6,431,452 B2 * | 8/2002 | Feng .................... 235/472.01 |
| 6,439,462 B1 | 8/2002 | Dickson et al. |
| 6,507,864 B1 | 1/2003 | Klein et al. |
| 6,535,493 B1 | 3/2003 | Lee et al. |
| 6,539,360 B1 | 3/2003 | Kadaba |
| 6,539,422 B1 | 3/2003 | Hunt et al. |
| 6,540,140 B1 | 4/2003 | Knowles et al. |
| 6,547,139 B1 | 4/2003 | Havens et al. |
| 6,561,428 B2 | 5/2003 | Meier et al. |
| 6,578,767 B1 | 6/2003 | Barkan et al. |
| 6,585,159 B1 | 7/2003 | Meier et al. |
| 6,595,422 B1 | 7/2003 | Dolijack |
| 6,601,768 B2 | 8/2003 | McCall et al. |
| 6,607,128 B1 | 8/2003 | Schwartz et al. |
| 6,629,641 B2 | 10/2003 | Tsikos et al. |
| 6,637,658 B2 | 10/2003 | Barber et al. |
| 6,655,595 B1 | 12/2003 | Longacre, Jr. et al. |
| 6,661,521 B1 | 12/2003 | Stern |
| 6,681,994 B1 | 1/2004 | Koenck |
| 6,688,523 B1 | 2/2004 | Koenck |
| 6,722,569 B2 | 4/2004 | Ehrhart et al. |
| 6,732,929 B2 | 5/2004 | Good et al. |
| 6,786,414 B2 | 9/2004 | Tsikos et al. |
| 6,808,114 B1 | 10/2004 | Palestini et al. |
| 6,817,525 B2 | 11/2004 | Piva et al. |
| 6,830,184 B2 | 12/2004 | Tsikos et al. |
| 6,832,725 B2 | 12/2004 | Gardiner et al. |
| 6,834,807 B2 | 12/2004 | Ehrhart et al. |
| 6,837,437 B2 | 1/2005 | Tsikos et al. |
| 6,843,417 B1 | 1/2005 | Philyaw et al. |
| 2001/0043273 A1 | 11/2001 | Herrod et al. |
| 2001/0055422 A1 | 12/2001 | Roustaei |
| 2002/0039099 A1 | 4/2002 | Harper |
| 2002/0066788 A1 | 6/2002 | Knowles |
| 2003/0062419 A1 | 4/2003 | Ehrhart et al. |
| 2003/0127519 A1 | 7/2003 | Ehrhart et al. |
| 2003/0222147 A1 | 12/2003 | Havens et al. |
| 2003/0226895 A1 | 12/2003 | Havens et al. |
| 2004/0020990 A1 | 2/2004 | Havens et al. |
| 2004/0031851 A1 | 2/2004 | Bianculli et al. |
| 2004/0035933 A1 | 2/2004 | Havens et al. |
| 2004/0129783 A1 | 7/2004 | Patel |

FOREIGN PATENT DOCUMENTS

| | | |
|---|---|---|
| DE | 12 40 149 B | 5/1967 |
| EP | 0 516 927 A | 12/1992 |
| EP | 0 910 032 A2 | 4/1998 |
| EP | 0 974 924 A | 1/2000 |
| EP | 0 999 514 A1 | 5/2000 |
| EP | 1 079 466 A | 2/2001 |
| EP | 1 128 315 A1 | 8/2001 |
| EP | 0 690 404 B1 | 9/2001 |
| EP | 0 818 750 B1 | 11/2001 |
| GB | 2 128 549 A | 5/1984 |
| JP | 3228193 A | 10/1991 |

| | | |
|---|---|---|
| JP | 4 330583 A2 | 11/1992 |
| JP | 4333187 | 11/1992 |
| JP | 2002/150215 A | 5/2002 |
| WO | WO 97/08647 | 3/1997 |
| WO | WO 97/28512 | 8/1997 |
| WO | WO 01/26036 A2 | 4/2001 |
| WO | WO 02/073953 A2 | 9/2002 |
| WO | WO 2004/064382 A | 7/2004 |

OTHER PUBLICATIONS

U.S. Appl. No. 10/782,569, filed Feb. 19, 2004, William H. Havens et al.

International Search Report for International Application No. PCT/US02/07161 dated Dec. 20, 2002.

International Search Report for International Application No. PCT/US03/17564 dated Sep. 18, 2003.

International Search Report for International Patent Application No. PCT/US03/18557 dated Feb. 25, 2004.

Provisional Application No. 60/437,959, filed Jan. 3, 2003, priority of which is claimed in U.S. Appl. No. 10/425,694, filed Apr. 29, 2003, 25 pages.

U.S. Appl. No. 10/440,729, filed May 19, 2003, U.S. Appl. No. 2004/0035933 A1, filed Mar. 24, 2005.

John H. Day, Optical ICs Look to Enterprise–Metro link, Electronic Engineering Times, Apr. 2002, 6 pp., http://www.eet.com/story/OEG20020418S0065.

* cited by examiner

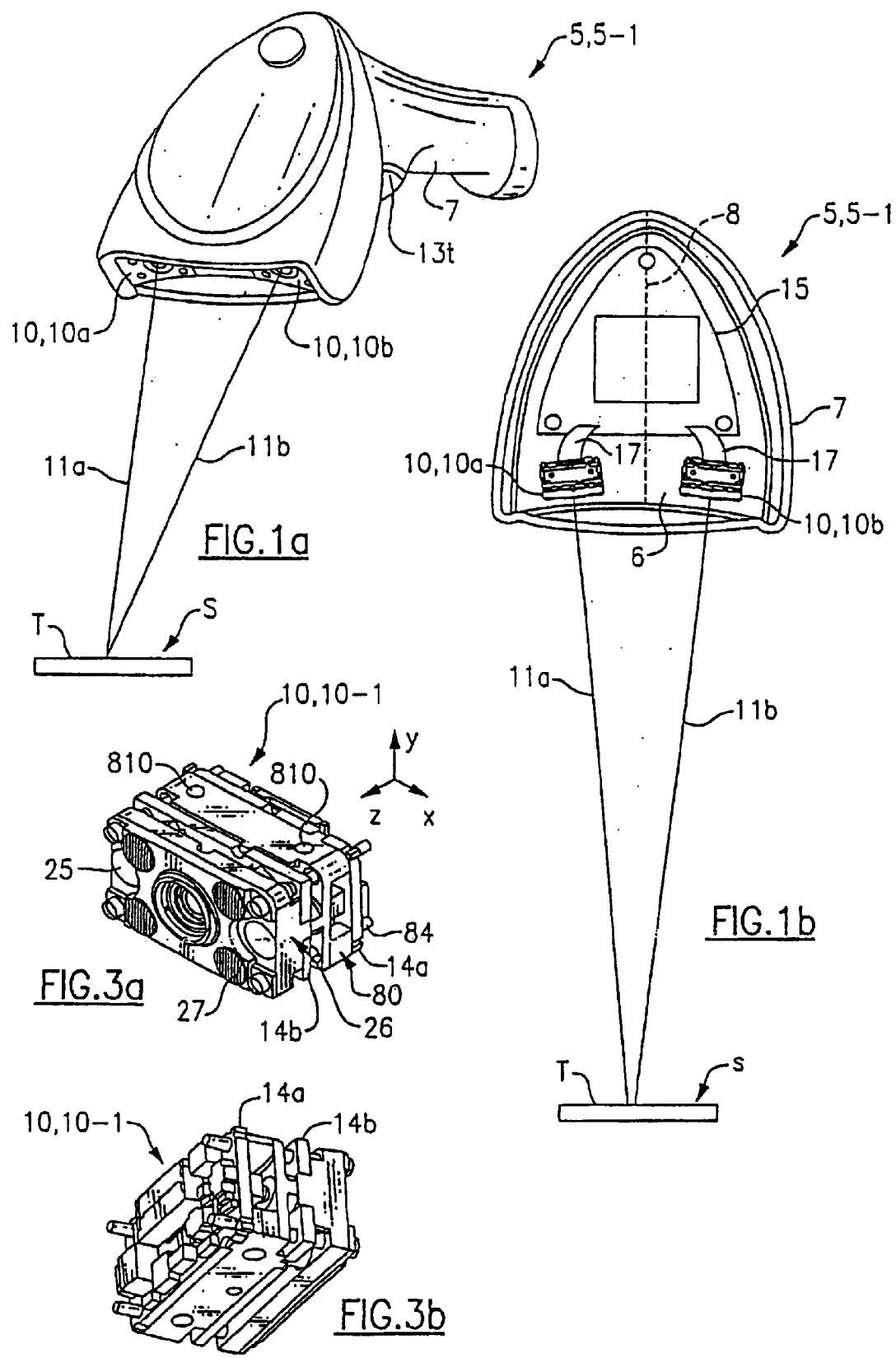

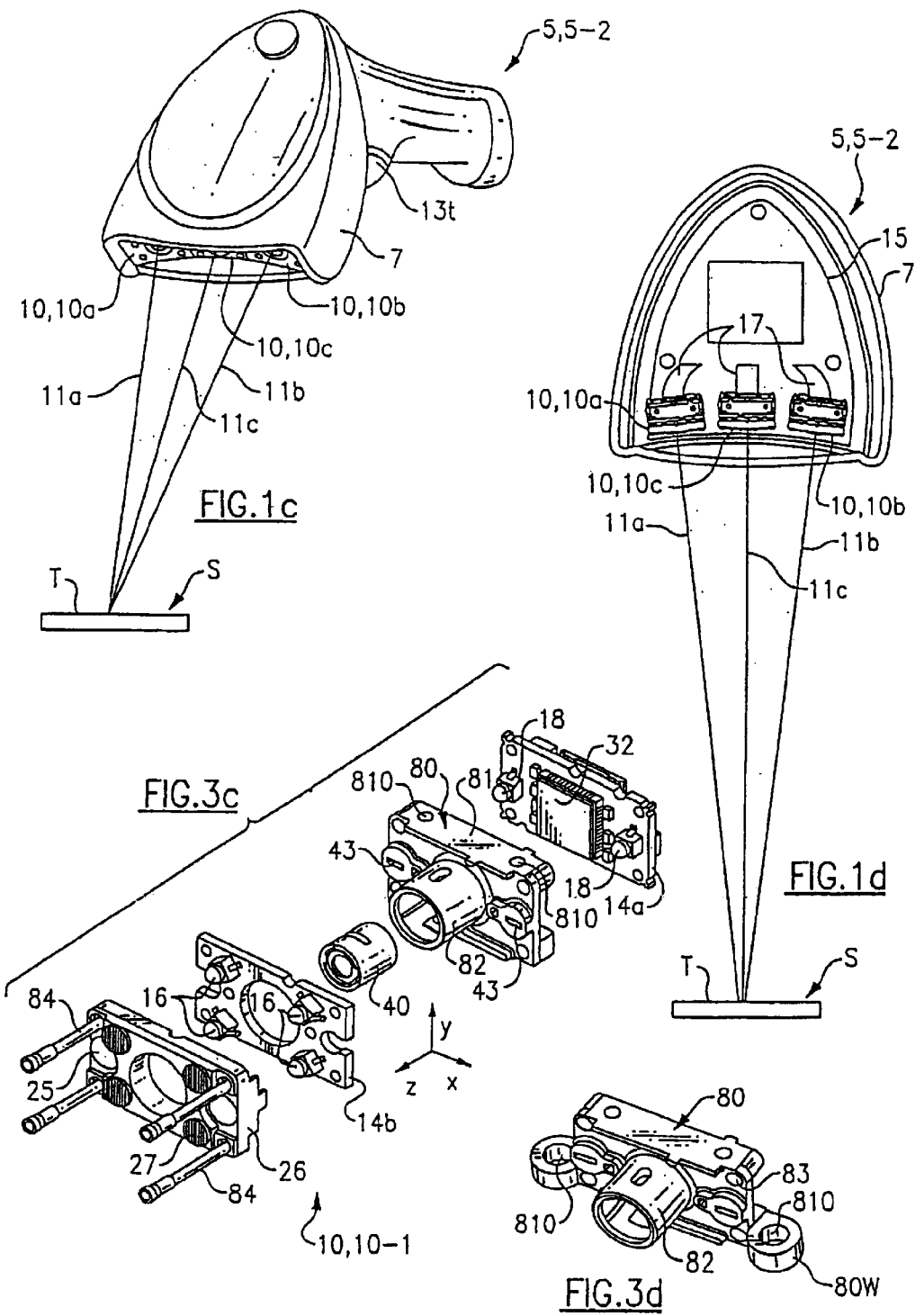

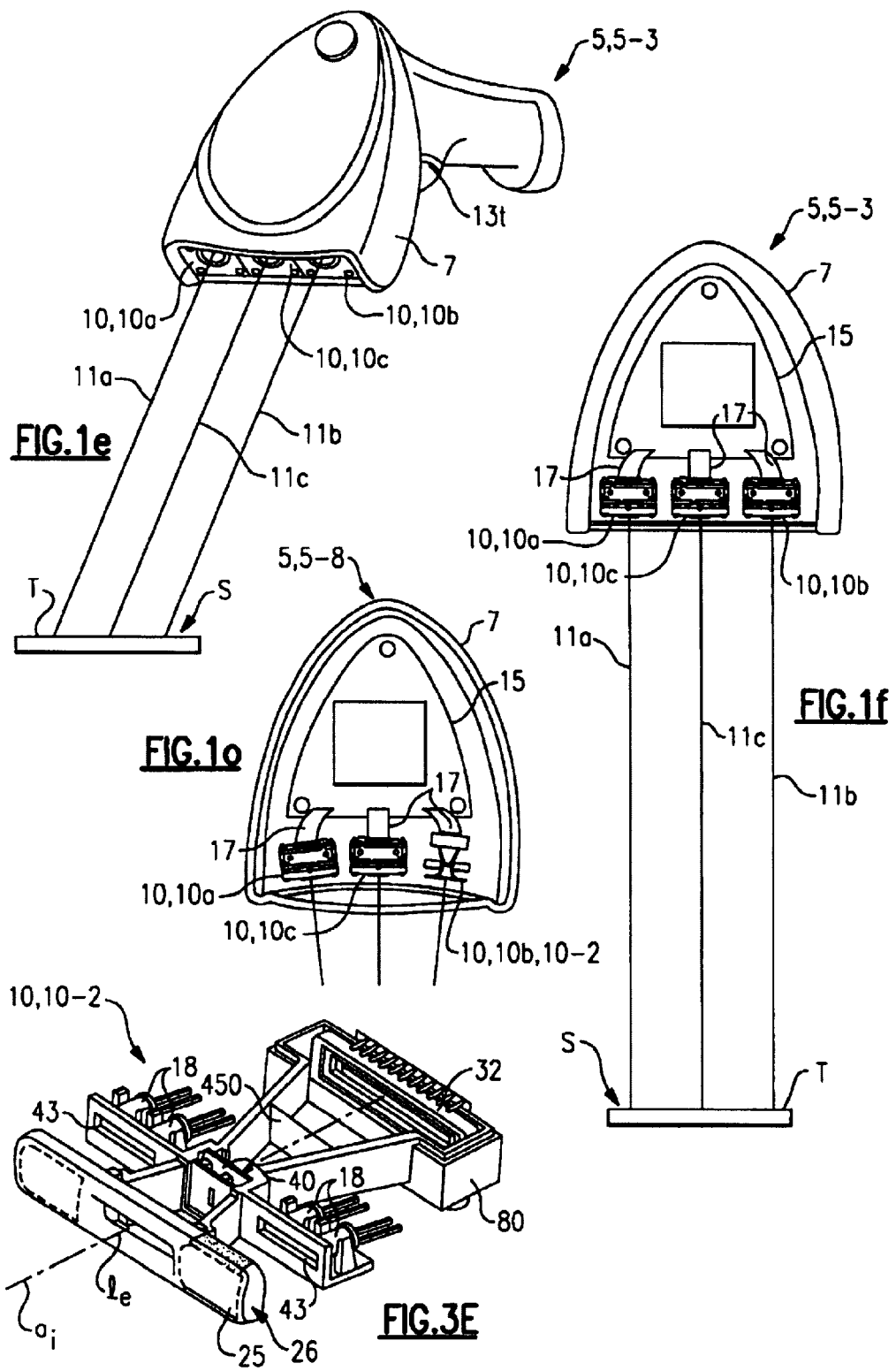

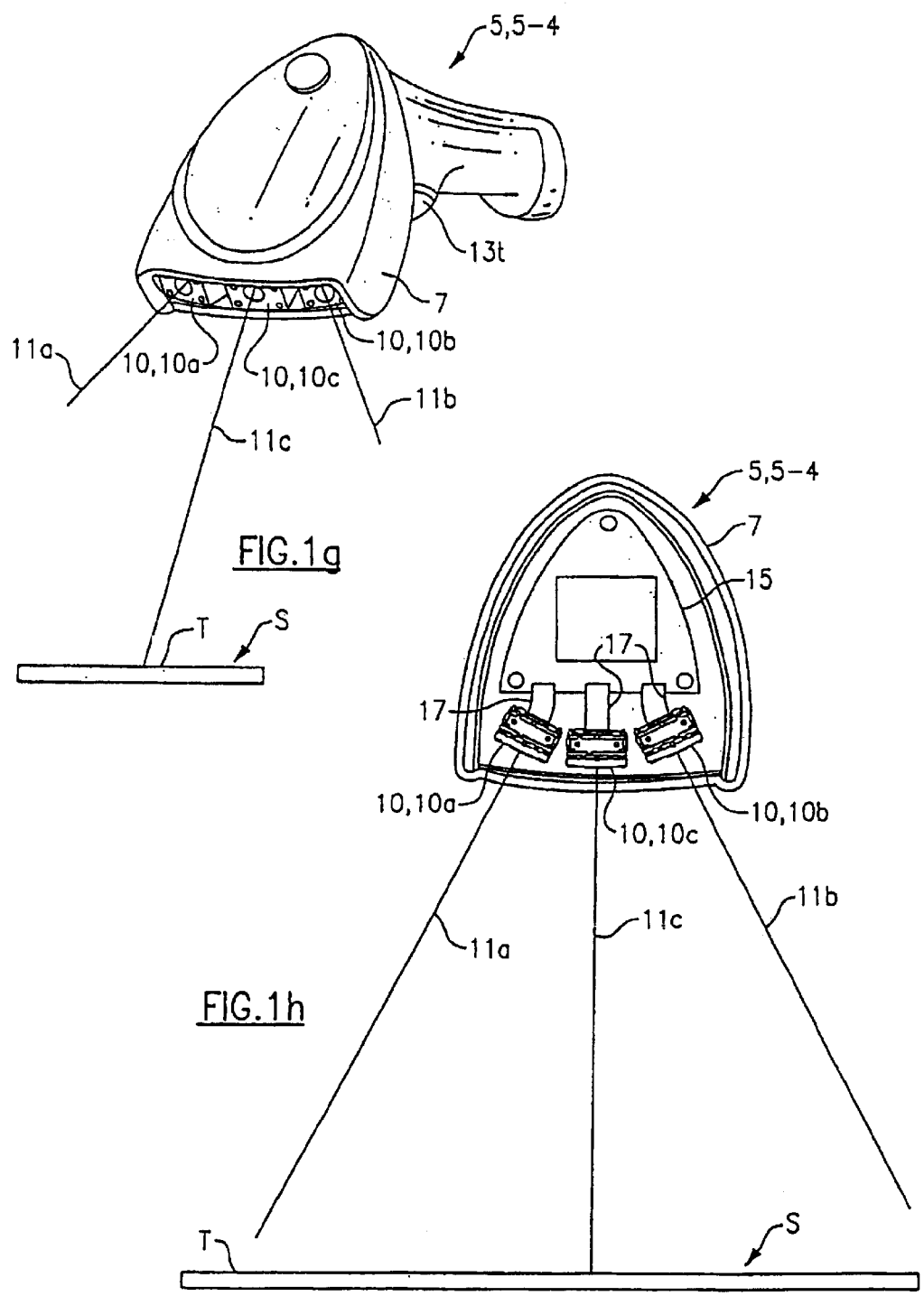

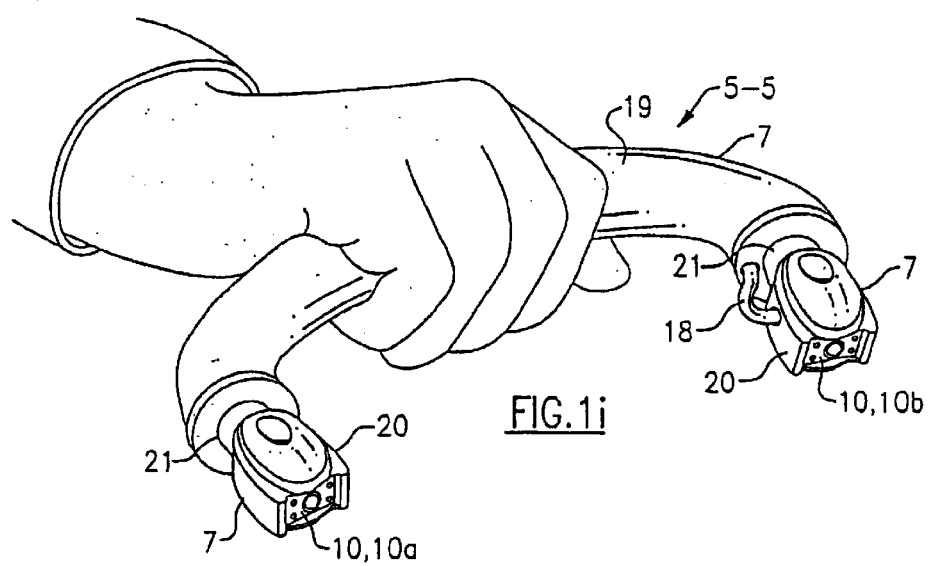
FIG.1i
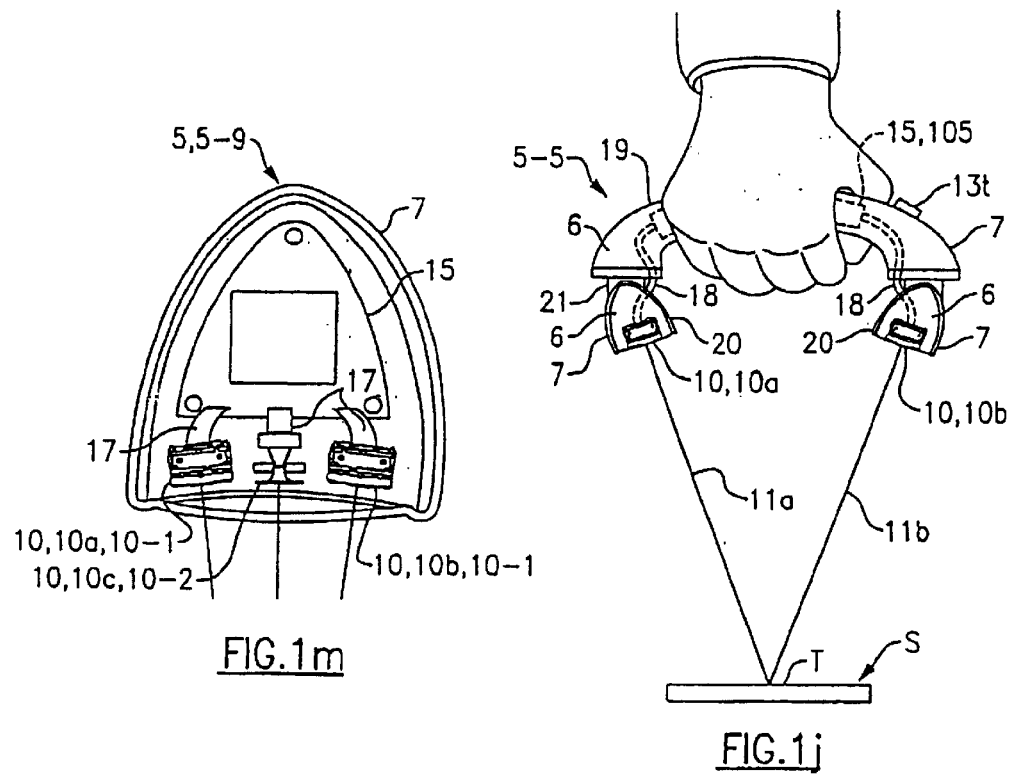
FIG.1m
FIG.1j

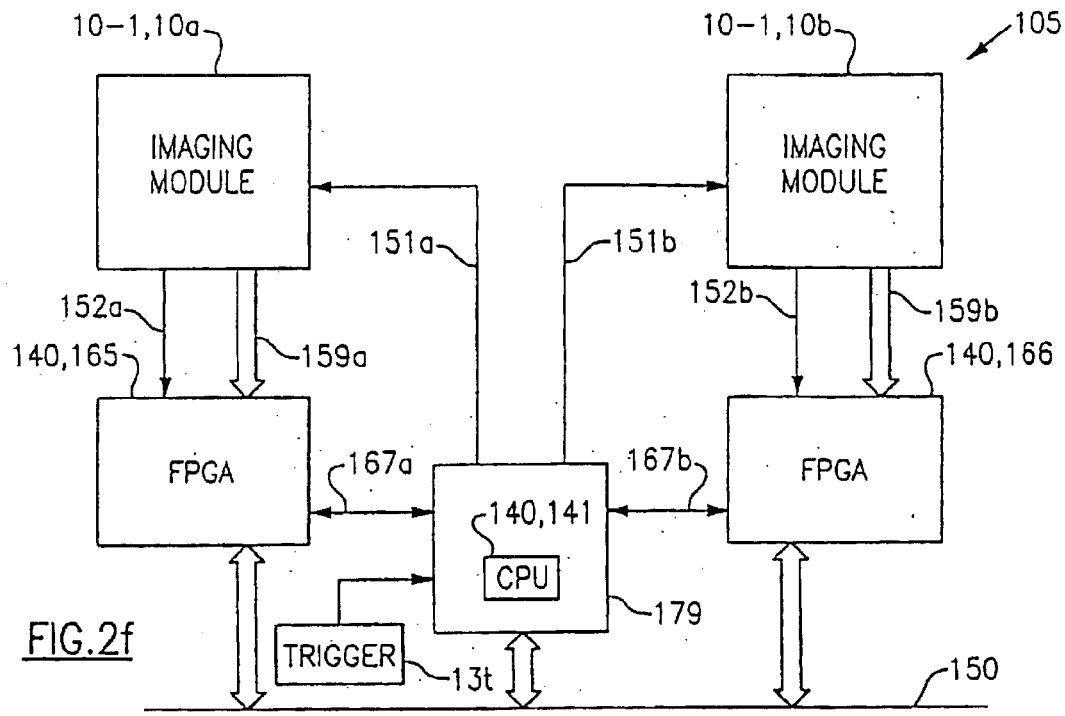
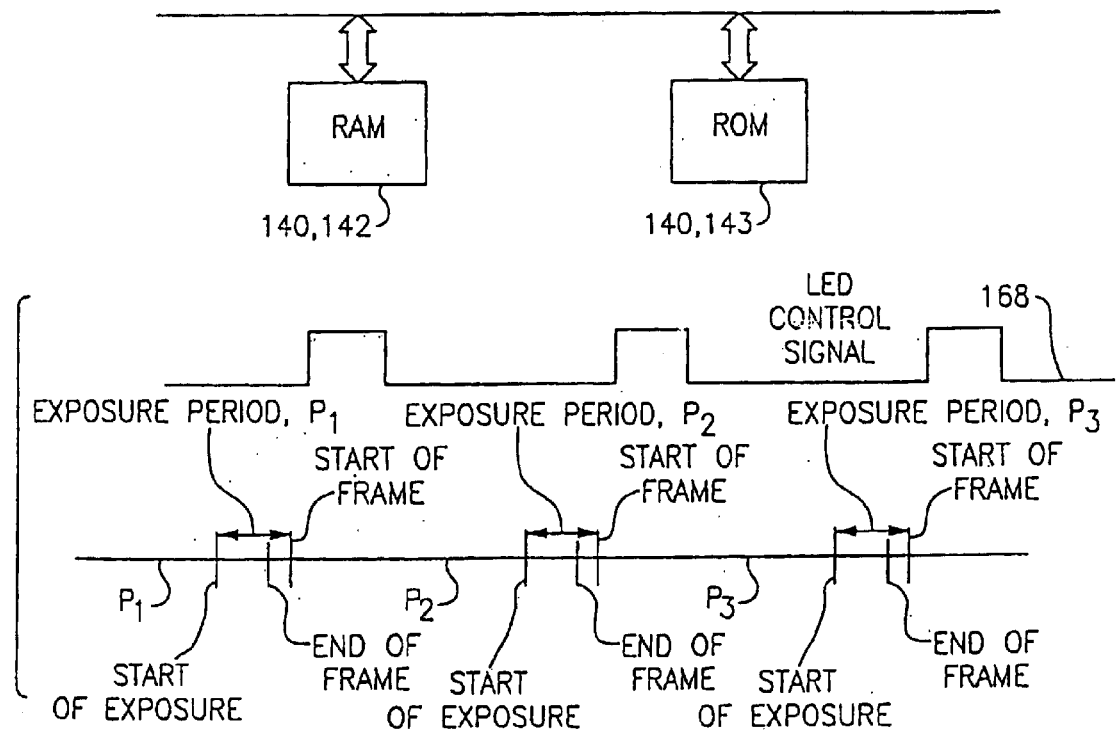

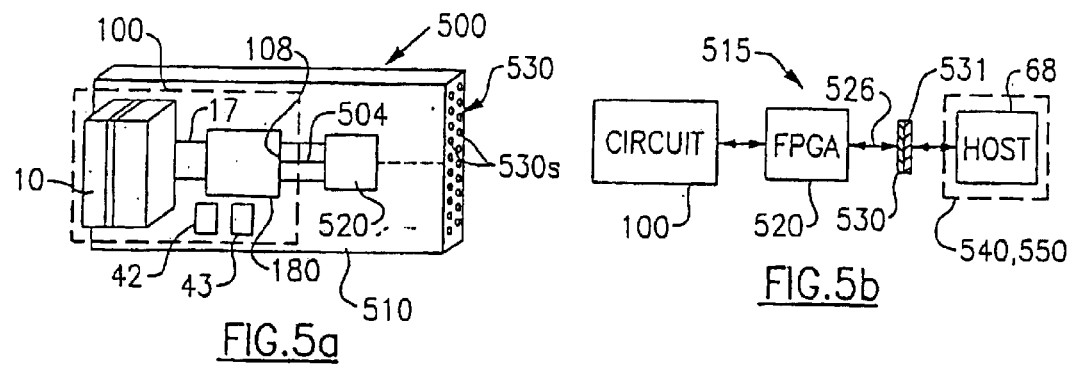
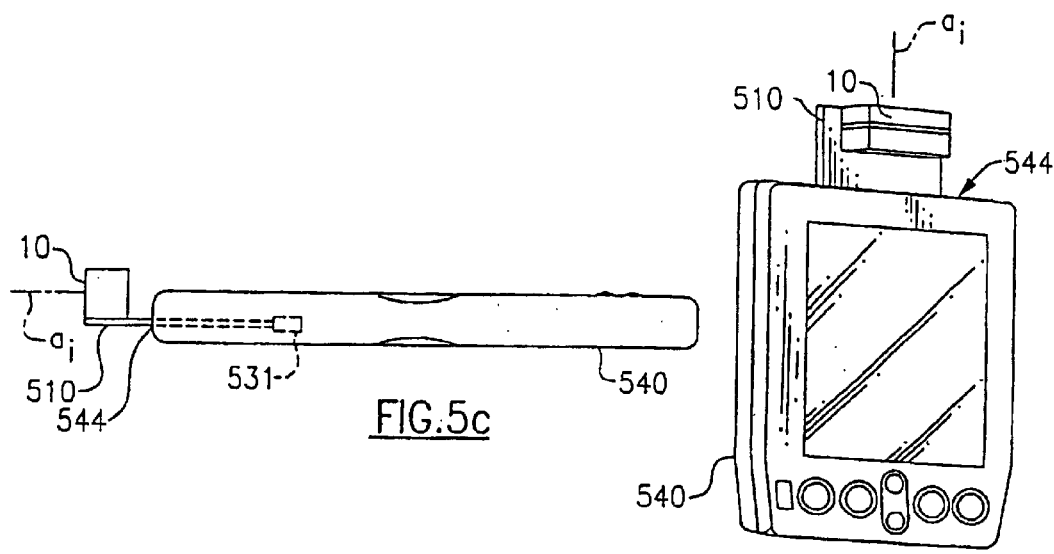
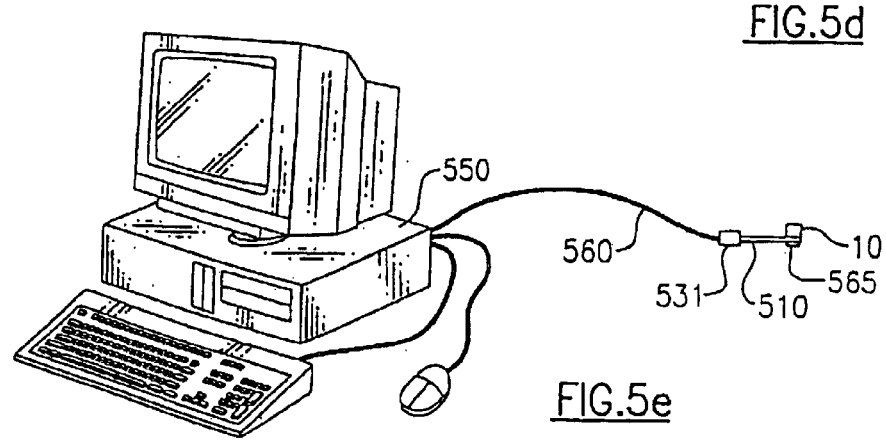

OPTICAL READER HAVING A PLURALITY OF IMAGING MODULES

CROSS-REFERENCE TO RELATED APPLICATIONS

This application is a continuation-in-part of application Ser. No. 10/161,950 filed Jun. 4, 2002 abandoned entitled "Optical Reader Having a Plurality of Imaging Modules." This application is also a continuation-in-part of U.S. patent application Ser. No. 10/440,729 filed May 19, 2003, which is a continuation-in-part of application Ser. No. 10/252,484 filed Sept. 23, 2002, entitled "Long Range Optical Reader," which claims the priority under 35 U.S.C. § 119, of provisional application Ser. No. 60/387,842 filed Jun. 11, 2002, entitled "Long Range Optical Reader." In addition to the claim of priority of application Ser. No. 60/387,842 through the priority claim of application Ser. No. 10/440,729 and application Ser. No. 10/252,484, this application claims the priority under 35 U.S.C. § 119 of application Ser. No. 60/387,842 independent of the priority claim to application Ser. No. 60/387,842 based on application Ser. No. 10/440,729 and application Ser. No. 10/252,484. The priorities of all of the above applications are claimed. All of the above applications are incorporated herein by reference.

FIELD OF THE INVENTION

The invention relates to optical readers in general and particularly to an optical reader having multiple image sensor devices.

BACKGROUND OF THE PRIOR ART

Decodable indicia such as bar codes and OCR decodable characters are finding increased use in an ever expanding variety of applications. Bar codes are being applied not only to paper substrate surfaces but other surfaces as well such as plastic bags, glass, and directly on finished articles. The affixing of a decodable indicia directly to an article is referred to as "direct part marking." Where decodable symbols or characters have been applied to particularly reflective "shiny" surfaces (glass, plastic, metallic surfaces), "specular reflection" decode failures have been observed.

"Specular reflection" occurs where a light ray incident on a highly reflective (mirror) surface is reflected substantially at an angle measured from the surface that is substantially normal with respect to the incident ray. In optical readers, light sources are positioned to emit light along a path closely adjacent a centrally located imaging axis. An optical reader light is directed at a reflective target and, therefore, the illumination light tends to be reflected specularily in the direction of the reader's photodetector elements. Specular reflection can result in the captured image data failing to exhibit adequate contrast between dark and light markings of a decodable indicia. With the increased miniaturization of optical readers, light sources for illuminating a target are being positioned in closer proximity with a photodetector element of the reader, thereby rendering the modern reader more susceptible to specular reflection read failures.

The proliferation of the use of decodable markings has brought to light additional problems with presently available optical readers. It has become more common to encode more information into single decodable indicia, e.g. with use of "high density" bar codes, to affix more than one decodable indicia onto an article or package in need of decoding, and to make bar codes wider so that they can encode more information. "High density" bar codes are best decoded with the use of a high resolution optical reader which is configured to have a short "best focus" position. Extra wide code bar codes and scenes having more than one bar code are best decoded with use of readers having a longer best focus position. Commercially available optical readers cannot easily read high density extra wide decodable symbols or multiple symbols from a scene which are encoded in high density.

There is a need for an optical reader which is impervious to decode failures resulting from specular reflection, and which is adapted to read large or multiple high density decodable symbols formed on a target.

SUMMARY OF THE INVENTION

The invention in one major aspect relates to an optical reader having more than one image sensor, wherein each image sensor can be incorporated in an imaging module that can include a combination of a support assembly, an image sensor, imaging optics, and at least one illumination light source.

In one embodiment the reader includes a gun style housing which houses a pair of 2D imaging modules. In another embodiment, the reader includes a gun style housing having three 2D imaging modules. The modules may have imaging axes that are in parallel, diverging or converging relation. One or more of the 2D imaging modules can be replaced with a 1D imaging module.

In another embodiment the reader module may include a "dumbbell" style housing having a central handle portion and a pair of laterally disposed head portions, each of the head portions housing an imaging module. The head portions can be made adjustable so that the relative position of the imaging axes of the two imaging modules can be adjusted. The dumbbell reader can be mounted on a presentation stand which further includes a third head portion which houses a third imaging module.

In another aspect, an optical reader of the invention can be operated using a control circuit which comprises a multi-functional processor IC chip which, in addition to having a central processing unit (CPU) includes a programmable integrated frame grabber block.

A control circuit of the invention can be adapted to carry out a variety of routines involving coordinated capture of image data utilizing more than one imaging module. In one example of the invention, a frame of image data is captured by actuation of a first imaging module and light sources from a first imaging module. The frame is then subjected to a decoding attempt. If the decoding attempt involving the first captured frame fails, a second frame of image data is captured by actuation of an image sensor of the first imaging module and actuation of a light source from a second imaging module and subjected to decoding. The second frame of image data captured utilizing a spaced apart illumination light source and image sensor from two spaced apart imaging modules can be expected to be free of image degradation problems attributable to specular reflection.

In another aspect of the invention, a control circuit can be configured to combine image data captured by a reader of the invention having more than one imaging module. Because the relative positions of imaging modules in a multiple imaging module reader of the invention are known, first and second frames of image data captured via actuation of first and second imaging modules of a reader of the invention can readily be combined according to an image frame combination method.

In a still further aspect of the invention, various imaging modules of a multiple imaging module optical reader can be configured to have different best focus positions. Configuring different imaging modules of a multiple imaging module optical reader to have different best focus positions improves the overall depth of field of the multiple imaging module optical reader.

These and other details and advantages will become apparent from the detailed description of the preferred embodiment hereinbelow.

BRIEF DESCRIPTION OF THE DRAWINGS

For a further understanding of these and objects of the invention, reference will be made to the following detailed description of the invention which is to be read in connection with the accompanying drawing, wherein:

FIGS. 1a–1n show various physical views of optical readers incorporating a plurality of imaging modules while FIG. 1o is a diagram illustrating an imaging module illumination pattern spanning a two-dimensional area that encompasses a target corresponding to a field of view of an image module;

FIGS. 2c–2f show block diagrams of various electrical circuits which may be utilized with readers according to the invention incorporating a plurality of imaging modules;

FIG. 2g is a timing diagram for illustrating control of aiming LEDs;

FIGS. 3a and 3b show, respectively, front and rear perspective views of a 2D optical reader according to the invention;

FIG. 3d illustrates a perspective view of an exemplary 2D support assembly for an exemplary 2D imaging module according to the invention;

FIG. 3e illustrates a perspective view of a 1D imaging module according to the invention;

FIG. 5a is a physical schematic view of a compact flash card incorporating a 2D imaging module;

FIG. 5b is an electrical block diagram illustrating a system comprising a device as shown in FIG. 5a in electrical communication with a host processor assembly;

FIGS. 5c and 5d are physical views of a the device shown in FIG. 5a as received in a personal data assistant;

FIG. 5e is a physical view illustrating a device as shown in FIG. 5a in communication with a personal computer and operating in free standing mode of operation.

DETAILED DESCRIPTION OF THE INVENTION

Figure 1K:
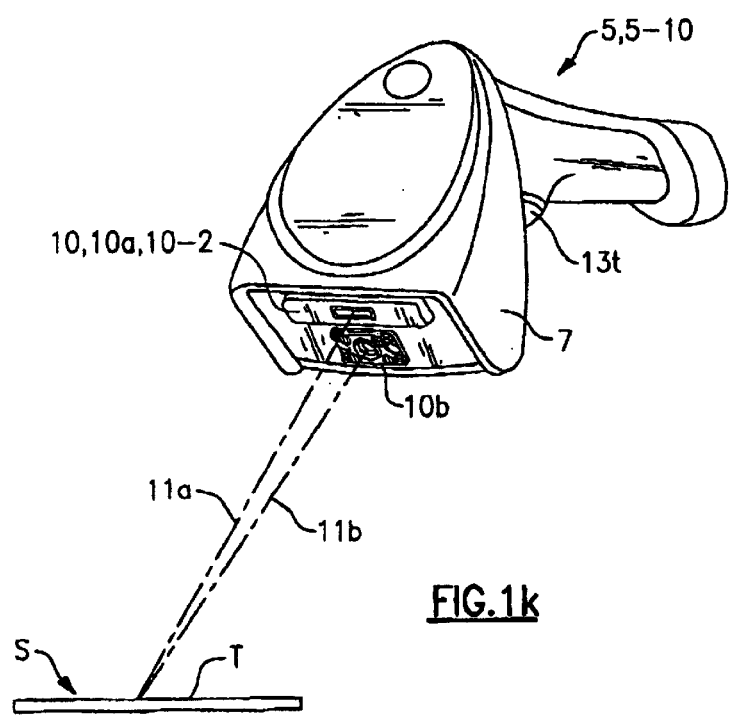

Embodiments of optical readers having more than one imaging module are shown in FIGS. 1a–1l. In FIGS. 1a–1b a gun style optical reader 5-1 is shown including first and second imaging modules 10a and 10b incorporated in housing 7. Imaging modules 10 can be of the type shown in FIGS. 3a–3d. Imaging module 10, 10-1 as shown in FIGS. 3a and 3c includes a support assembly 80 having a containment section 81 and a retainer section 82, a first circuit board 14a carrying an image sensor 32, a second circuit board 14b, illumination LEDs 16 aiming LEDs 18, an optical plate 26 carrying aiming and illumination optics 25, 27 and support posts 84 holding the various components of the module together. Image sensor 32 as shown in FIGS. 1a–1e includes an area array of photosensitive elements, such as an area (2D) photodiode array. Further details of imaging module 10-1 are described in application Ser. No. 10/092,789, filed Mar. 7, 2002, entitled "Optical Reader Imaging Module," incorporated herein by reference. As indicated by FIGS. 3a and 3b imaging modules 10 can can be built as a modularly installable self-contained unit. That is, module 10 can be assembled into the packaged form shown in FIGS. 3a and 3b at an assembly location prior to being installed in a cavity defined by reader housing 7. Imaging module 10 may be configured to that illumination LEDs 16 together with light diffusing illuminating optics 27 disposed on plate 26 and wedges (disposed on a rear surface of plate 26) project an illumination pattern 520, while aiming LEDs 18 together with aiming optics 25 disposed on plate 26 projects an aiming pattern 630, as is shown in FIG. 1o. Illumination pattern 520 spans a two-dimensional area that encompasses target, T, corresponding to a filed of view of imaging module 10 and which is substantially coincident with a target corresponding to a field of view of imaging module 10. Aiming pattern 630 includes a portion that is projected within target area T, corresponding to a field of view of imaging module 10. In a further aspect, imaging module 10 can also be configured to have a fixed best focus position by fixably securing an imaging lens assembly 40 within a lens retainer 82. Lens assembly 40 focuses an image of a target onto image sensor 32.

Imaging module 10 can be screw mounted on any rigid member within housing 7 in the manner described in application Ser. No. 10/092,789 filed Mar. 7, 2002, entitled "Optical Reader Imaging Module," incorporated herein by reference hereinabove. Module 10 can include screw holes 810 for facilitating mounting of module 10 on a rigid member. As indicated by support assembly 80 of FIG. 3d, support assembly 80 can include wings 80w having screw holes 810. Reader 5 can include a main circuit board 15 or "mother board" which includes control circuit circuitry as described in detail in connection with FIGS. 2a–2f. In one embodiment, as indicated by reader 5-2 of FIG. 1d, a plurality of imaging modules 10 can be mounted to a rigid member provided by a common main circuit board 15. Imaging modules 10 can be interfaced with mother board 15 with use standardly known flex strip connectors 17.

Module 10a and module 10b are disposed in a common cavity 6. A wall 8 formed in housing 7 dividing cavity 6 into two spaces would not create two separate cavities since cavity 6 of reader 5-1 would still be delimited by the common outer peripheral wall of housing 7.

Incorporating more than one imaging module 10 in an optical reader housing 7 yields a number of advantages. For example, if an attempt to decode a decodable indicia by capturing and subjecting to decoding an image captured via actuation of first module 10a fails, a second decoding an attempt can be made by capturing and subjecting to decoding image captured via actuation of second imaging module 10b. Further, reader 5 can be actuated to capture and subject to decoding a frame of image data captured by actuation of an image sensor 32 of a first module 10a and illumination LEDs 16 of a second imaging module 10b. The spacing between illumination LEDs 16 of a second module 10b and an image sensor 32 of a first imaging module 10a renders the frame of image data capture by the described method substantially impervious to specular reflection image degradation.

In addition, image data of several frames captured by actuation of several different imaging modules can be combined, by one of several possible image frame combination methods, to yield a larger frame of image data. The larger image representation is yielded by combining multiple frames of image data and can be subjected to decoding, thereby facilitating decoding of larger decodable indicia or multiple decodable indicia printed over a large area of a target substrate. Specular reflection avoidance and frame image combination methods will be described in greater detail herein.

In the embodiment of FIGS. 1c and 1d, reader 5-2 comprises three imaging modules including a first imaging module 10a, second imaging module 10b and third imaging module 10c each having a respective imaging axis 11a, 11b, and 11c. Like reader 5-1 (FIGS. 1a and 1b) the imaging axes of reader 5-2 of FIGS. 1c and 1d are in converging relation. Configuring reader 5-2 so that modules 10 are in converging relation assures that each of a reader's imaging modules (10a, 10b, and 10c in reader 5-2) are positioned to capture images corresponding to substantially the same area of a target substrate. Accordingly, as will be explained in further detail herein readers 5-1 and 5-2 as shown in FIGS. 1a–1d are particularly well suited for reducing specular reflection misreads.

In FIGS. 1e–1h multiple imaging module optical readers 5 are shown which are particularly well-suited for applications wherein frames of image data generated by actuation of several imaging modules are configured to develop large field image representations. In the embodiment of FIGS. 1e and 1f, reader 5-3 including gun style housing 7 has installed therein three imaging modules 10a, 10b, and 10c wherein the imaging axes 11a, 11b, and 11c, of the three modules are in substantially parallel relation.

In the embodiment of FIGS. 1g and 1h reader 5-4 comprising gun style housing 7 has installed therein three imaging modules, wherein the imaging axes 11a, 11b, and 11c of the three modules are in diverging relation. Reader 5-3 and reader 5-4 are especially well suited for applications requiring an enlarged field of view. By way of routines which will be described in greater detail herein, frames of image data captured by actuation of three modules can be combined to yield a larger frame of image data comprising an image representation of an enlarged decodable symbol or character or of multiple decodable indicia.

Referring now to FIGS. 1i and 1j, dumbbell style multiple imaging module optical reader 5-5 is described.

Dumbbell reader 5-5 is a reader including three housing portions 7 and each defining a cavity 6. Reader 5-5 of FIGS. 1i and 1j includes a central handle 19 which supports a pair of laterally disposed head sections 20. Handle 19 may include a thumb-actuated trigger 13t. Installed in each head section 20 is an imaging module 10 which may be of the type described in connection with FIGS. 3a–3d. Imaging module 10 of reader 5-5 as in the case of readers 5-1, 5-2, 5-3, and 5-4 may be screw mounted on any rigid member within head sections 20. Head sections 20 of housing 7 are mounted to the major body of housing 7 by ball and socket type connectors 21. Ball and socket connectors 21 may be provided, for example, by a ball and socket connector of a type available from R-A-M Mounting Systems, Inc. of Chandler Ariz. Ball and socket connectors 21 may include mechanical detent mechanisms providing feel feedback as to the position of head section 20 so that a user may click head sections 20 into one or more normally defined positions. Flexible cable 18 as shown in FIGS. 1i and 1j can be disposed to provide electrical communication between modules 10 and a main circuit board 15 within a cavity defined by a handle portion of housing 7. Main circuit board 15 of reader 5-5 may carry components of a multiple module electrical circuit, e.g. circuit 105 described with reference to FIG. 2f.

Figure 1L:
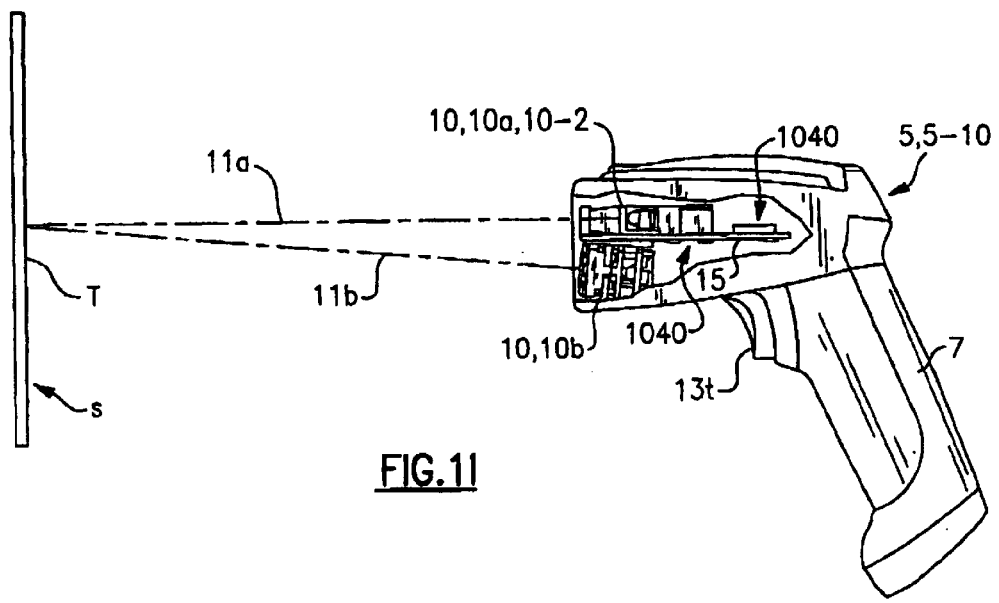
Figure 1N:
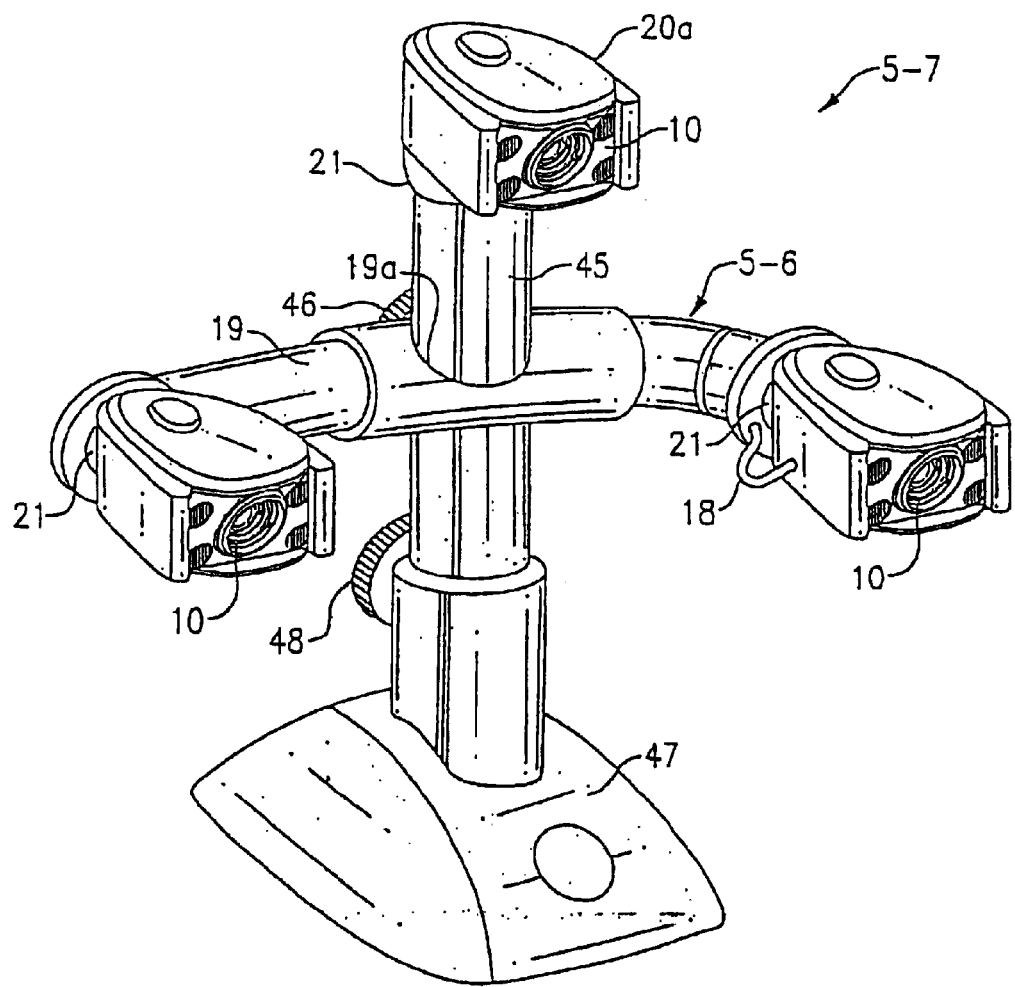
Figure 1P:
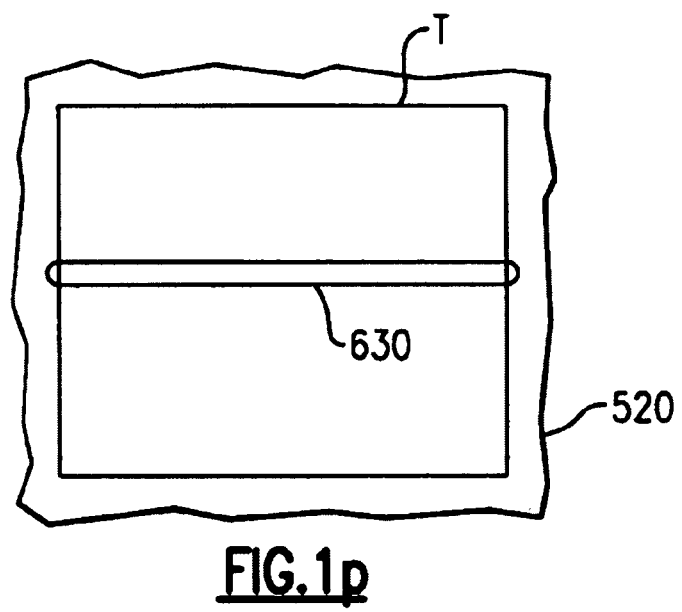

In the embodiment of FIG. 1n, handle 19 of dumbbell style reader 5-7 includes a central aperture 19a which is fittable about post 45. Handle 19 includes knob actuated bolt 46 for securing dumbbell style reader 5-6 against post 45. Post 45 in the embodiment of FIG. 1k is part of a presentation style reader 5-7 which, in addition to including detachable dumbbell style reader 5-6 further includes stand 47 including knob actuated bolt 48 for enabling a vertical position of post 45 to be adjusted, and top head section 20a disposed at a top of post 45. Head section 20a may be mounted to post 45 with use of ball and socket connector 21. Dumbbell style optical reader 5-6 may be removed from post 45 so that dumbbell style reader 5-6 can be used in a hand held mode. For realization of a hand held mode, knob actuated bolt 48 is loosened and post 45 is removed from stand 47. Knob actuated bolt 46 is then loosened and dumbbell style reader 5-6 is removed from post 45 to allow hand held use.

A dumbbell style reader e.g. 5-5 and 5-6 is particularly well suited for use in applications wherein specular reflection read failures can be expected. In the example of FIG. 1j, dumbbell style reader 5-5 is shown in a mode wherein head sections 20 are canted in a position such that imaging axes 11a and 11b of module 10a and module 10b are in converging relation and positioned so the imaging modules 10a and 10b generate image data corresponding to substantially the same scene at a target substrate, S, when reader 5-5 is at certain reader-to-target distance. If module 10a is positioned with respect to a reflective target T such that specular reflection from target T results in a decode failure, a frame of image data captured by actuation of illumination light sources 16 and an image sensor 32 of second module 10b can be subjected to a second decoding attempt. In addition, an expectedly specular reflection-free frame of image data can be captured by actuation of image sensor 32 of first imaging module 10a in combination with actuation of illumination of second imaging module 10b in place of illumination from first imaging module. The term "target" herein refers to subject matter (e.g. decodable indicia) presently in a field or view of at least one module of reader 5. The term "target substrate" refers to a member (e.g. a piece of paper, an equipment part) bearing subject matter to which reader may be directed.

The multiple imaging module optical readers as shown in FIGS. 1a–1j, and 1m include 2D imaging modules, which may be for example Model IT 4200, Model IT 4250, or Model IT 4000 imaging modules of the type available from Hand Held Products, Inc. of Skaneateles Falls, N.Y. It will be understood that a 2D imaging module of any of the readers shown could be replaced by a 1D imaging module having a 1D image sensor. An example of a 1D imaging module which can be incorporated in any one of readers 5-1, 5-2, 5-3, 5-4, 5-5, 5-6, and 5-7 is shown in FIG. 3e. Imaging module 10-2 includes a 1D image sensor 32 including a linear array of photosensitive elements, a support assembly or frame 80, imaging optics 40, illumination light sources 18, and illumination optics including lens 25 carried by plate 26 and aiming apertures 43. Further details of an exemplary 1D imaging module are described in U.S. Pat. No. 6,119, 939, entitled "Optical Assembly For Bar Code Scanner" incorporated herein by reference. In an image sensor array based 1D imaging module e.g. module 10-2 illumination and aiming light sources are normally provided by the same light sources which project a single illumination pattern which also serves as an aiming pattern. However, a 1D imaging module can also include light sources which project different illumination and aiming patterns. An imaging module of the invention can also comprise a laser diode based 1D imaging engine including a single photodetector, a laser diode and means for sweeping the laser beam projected by the laser diode across a target area.

Referring now to reader 5-9 of FIG. 1m, center module 10c of reader 5-9 is a 1D imaging module while laterally disposed modules 10a and 10b are 2D modules. Configuring reader 5-9 so that reader 5-9 includes a center 1D imaging module 10c, 10-2 and laterally disposed 2D imaging modules 10-1 provides certain advantages. Reader 5-9 can be programmed in accordance with a decode operation control program wherein a reader (1) first captures and subjects to decoding an image captured via actuation of first imaging module 10c, and if the decoding attempt fails, (2) automatically captures and subjects to decoding a second image captured via actuation of an image sensor and illumination of one of laterally disposed 2D modules 10a and 10b.

One-dimensional bar code symbols are more common than 2D bar code symbols. Further, 1D bar code symbols are generally decoded more quickly and more accurately by capturing and processing 1D slice image data captured via actuation of a 1D image sensor than capturing and processing 2D image data captured via actuation of a 2D image sensor. Still further, an imaging axis 11c of center imaging module 10c disposed in a gun-style housing 7 can more readily be aligned with an indicia of a target, T, than lateral imaging modules 10a and 10b. Accordingly, it can be seen that reader 5-9 programmed in accordance with the above-described decode program is a reader which is both mechanically configured and programmed for optimization of the decoding of 1D symbols, while still having the capacity to decode matrix 2D symbols where matrix 2D symbols are present within a target, T.

Referring to FIGS. 1K–1L a hand held "gun style" reader having a plurality of imaging modules with imaging axes 11a and 11b aligned in the vertical plane is described. In the embodiment of FIGS. 1K–1L, reader 5, 5-10 includes a one dimensional imaging module 10, 10a, 10-2 as shown in and described in connection with FIG. 3e and a two dimensional imaging module 10, 10b, and 10-1 as shown in FIG. 3e. As best seen from the side view FIG. 1L two dimensional imaging module 10a is mounted on a bottom surface of printed circuit board 15 and one dimensional imaging module 10a is mounted on a top surface of printed circuit board 15. Printed circuit board 15 carries both of imaging module 10a and imaging module 10b. Printed circuit board 15 further carries circuitry 1040 for operating both of imaging module 10a and imaging module 10b. Printed circuit board 15 may carry for example, components of circuit 104 to be described in connection with FIG. 2e. In the embodiment of FIGS. 1K–1L imaging modules 10a, 10b are configured so that imaging axes 11a, 11b are in converging relation in the manner described in connection with the embodiment of FIG. 1b.

In one variation of the embodiment of FIGS. 1K–1L, imaging modules 10a, 10b are disposed in reader housing 7 so that imaging axes 11a, 11b are in parallel relation in the manner of the embodiment of FIG. 1f.

In another variation of the embodiment of FIGS. 1K–11L, imaging modules 10a, 10b are disposed so that imaging axes 11a, 11b are in diverging relation in the manner of the embodiment of FIG. 1h.

In another variation of the embodiment of FIGS. 1K–1L, one dimensional imaging module 10a is replaced with a two dimensional imaging module. In another variation of the embodiment of FIGS. 1K–1L two dimensional imaging module 10b is replaced with a one dimensional imaging module. In a variation of the embodiments described an additional one or more one dimensional or two dimensional imaging module is disposed in reader housing 7 in the vertical plane including imaging axis 11a and imaging axis 11b.

Figure 2A:
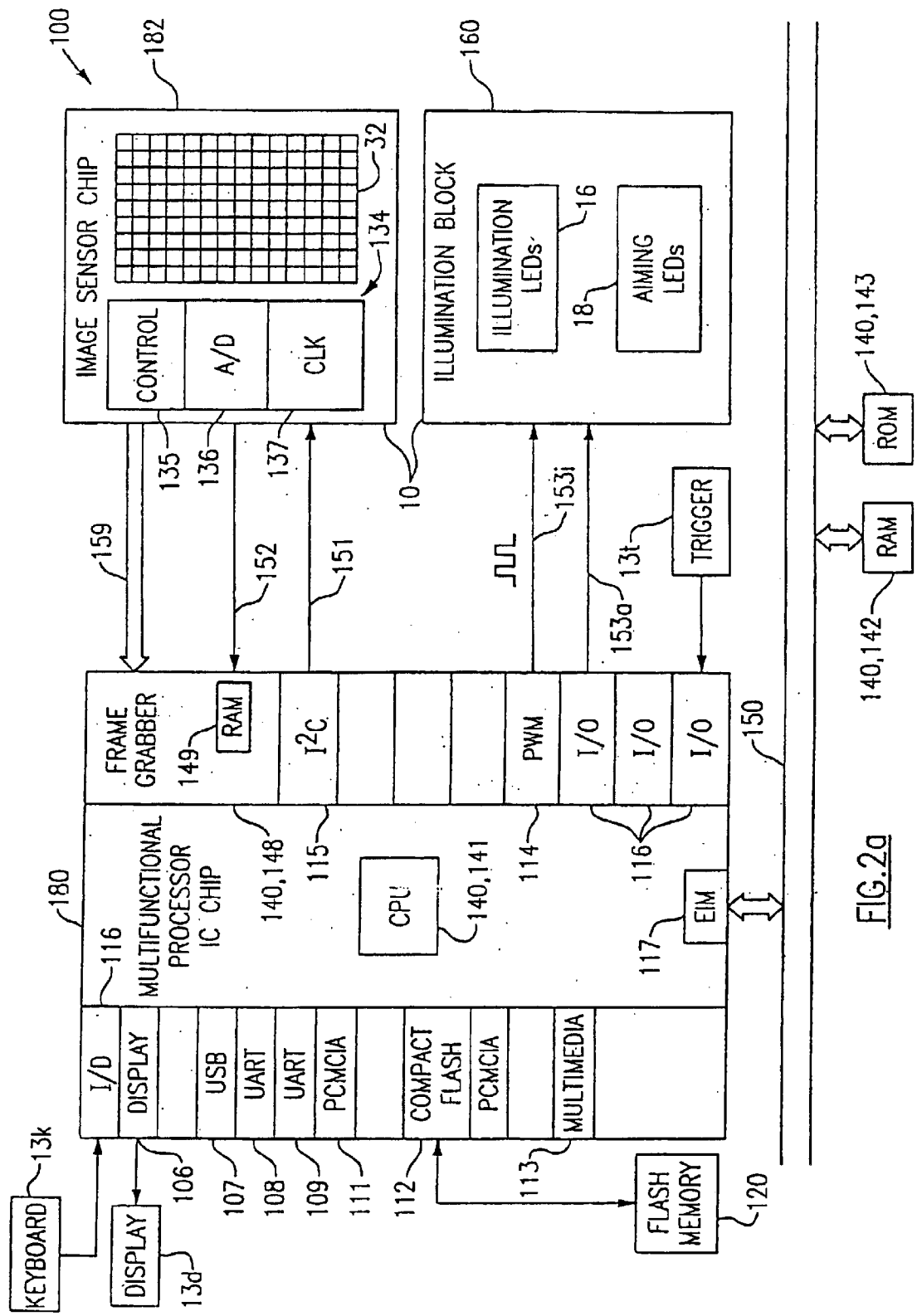
FIGS. 2a and 2b are electrical block diagrams of electrical circuits which may be utilized with a reader incorporating a single imaging module.
Figure 2B:
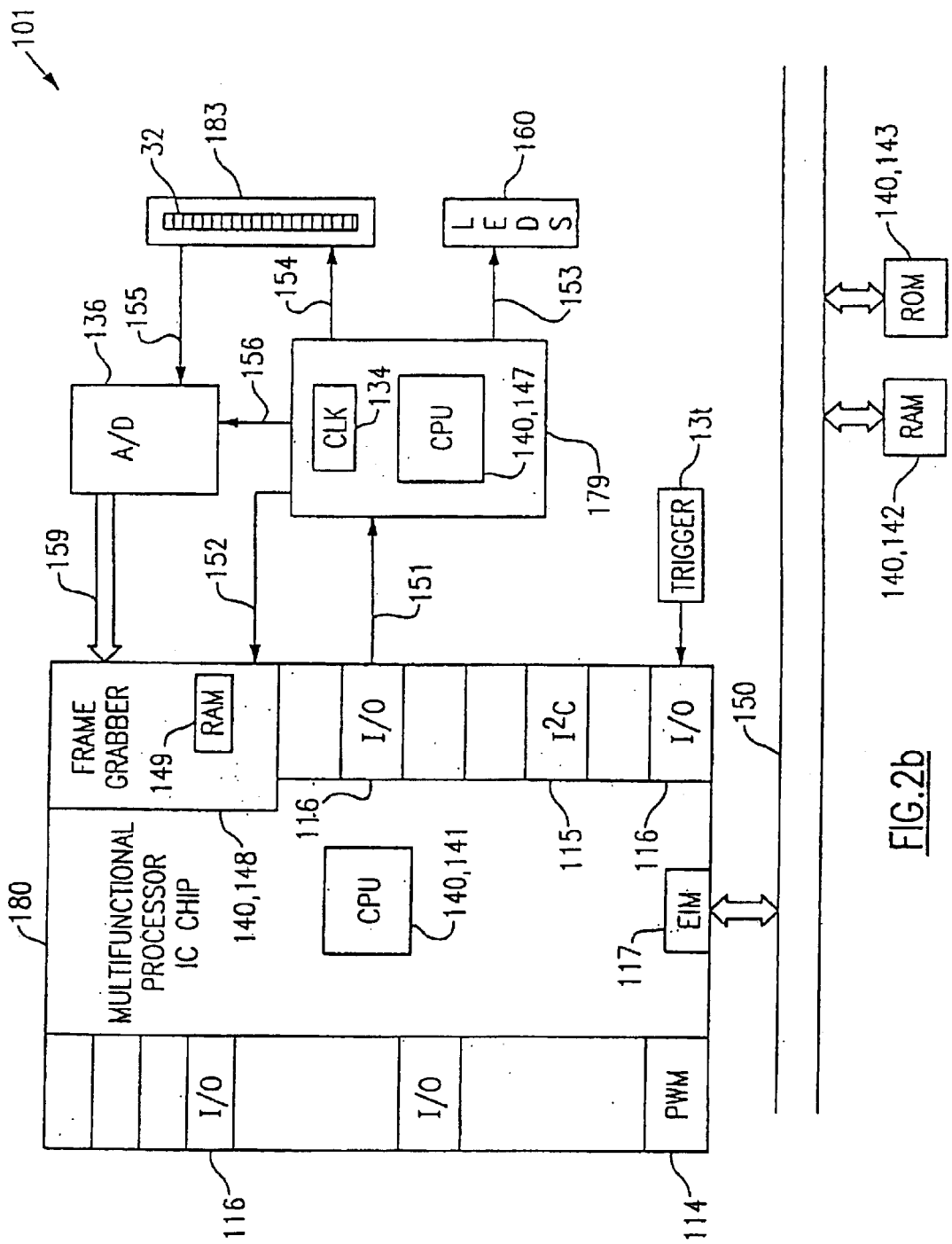

Various electrical circuits 100, 101, 102, 103, 104, and 105 which can be utilized to control optical readers are shown and described with reference to FIGS. 2a, 2b, 2c, 2d, 2e, and 2f. While the present invention relates in a major aspect to optical readers having more than one imaging module, FIGS. 2a and 2b show electrical circuits for operating optical readers having a single imaging module. Numerous principles of circuit operation discussed in relation to circuits 100, 101 are incorporated into multiple imaging module electrical circuits 102, 103, 104, 105 discussed in relation to FIGS. 2c–2f.

In FIG. 2a a block diagram of an optical reader electrical circuit is shown having a multi-functional processor IC chip 180 including an integrated frame grabber block 148. Electrical circuit 100 shown in FIG. 2a can be utilized for control of a single 2D imaging module optical reader as is shown for example in U.S. application Ser. No. 09/954,081 filed Sep. 17, 2001, entitled "Optical Reader Having Image Parsing Mode," incorporated herein by reference.

In the specific embodiment of FIG. 2a, electrical circuit 100 includes a control circuit 140 comprising CPU 141, system RAM 142 and system ROM 143 and frame grabber block 148. Electrical circuit 100 further includes an image sensor 32 typically provided by a photosensitive array and an illumination block 160 having illumination LEDs 16 and aiming LEDs 18 as shown in the physical form view of FIGS. 3a–3c. Image sensor 32 of FIG. 2a is shown as being provided by a 2D photo diode array. If image sensor 32 is replaced by a 1D image sensor, then aiming LEDs 18 and illumination LEDs 16 may be constituted by one set of LEDs. In the embodiment shown, image sensor 32 incorporated in an image sensor IC chip 182 which typically further includes an image sensor electrical circuit block 134. Image sensor electrical block 134 includes control circuit 135 for controlling image sensor 32, an A/D conversion circuit 136, for converting analog signals received from image sensor 32 into digital form and integrated clock 137 sometimes referred to as an oscillator.

In the embodiment shown in FIG. 2a, CPU 141 and frame grabber block 148 are incorporated in a multi-functional IC chip 180 which in addition to including CPU 141 includes numerous other integrated hardware components. Namely, multifunctional IC chip 180 may include a display control block 106, several general purpose I/O ports 116, several interface blocks such as a USB circuit block 107 and a UART block 108 for facilitating RS 232 communications, a UART block 109 for facilitating Irda communications, and a pulse width modulation (PWM) output block 110. Multifunctional processor IC chip 180 can also have other interfaces such as a PCMCIA interface 111, a compact flash interface 112, and a multimedia interface 113. If reader 5 includes a display 13d, display 13d may be in communication with chip 180 via display interface 106. Trigger 13t and keypad 13k may be in communication with chip 180 via general purpose I/O interface 116. Physical form views of readers having displays and keyboards are shown for example in U.S. application Ser. No. 10/137,484, filed May 2, 2002, entitled "Optical Reader Comprising Keyboard," incorporated herein by reference. Multi-functional processor IC chip 180 may be one of an available type of multifunctional IC processor chips which are presently available such as a Dragonball IC processor chip available from Motorola, an Anaconda IC processor chip available from Motorola, a DSC IC chip of the type available from Texas Instruments, an O-Map IC chip also of the type available from Texas Instruments or a multifunctional IC processor chip of a variety available from Clarity, Inc.

Frame grabber block 148 of IC chip 180 replaces the function of a frame grabbing field programmable gate array (FPGA) as discussed in commonly assigned application Ser. No. 09/954,081, filed Sep. 17, 2001, entitled "Imaging Device Having Indicia-Controlled Image Parsing Mode," incorporated herein by reference and application Ser. No. 09/904,697, filed Jul. 13, 2001, entitled "An Optical Reader Having a Color Imager" incorporated herein by reference. More particularly, frame grabber block 148 is specifically adapted collection of hardware elements programmed to carry out, at video rates or higher, the process of receiving digitized image data from image sensor chip 182 and writing digitized image data to system RAM 142 which in the embodiment shown is provided on a discreet IC chip. Frame grabber block 148 includes hardware elements preconfigured to facilitate image frame capture. Frame grabber block 148 can be programmed by a user to capture images according to a user's system design requirements. Programming options for programming frame grabber block 148 include options enabling block 148 to be customized to facilitate frame capture that varies in accordance with image sensor characteristics such as image sensor resolution, clockout rating, and fabrication technology (e.g. CCD, CMOS, CID), dimension (1D or 2D) and color (monochrome or color).

Aspects of the operation of circuit 100 when circuit 100 captures image data into RAM 140 are now described. When trigger 13t is pulled, CPU 141, under the operation of a program stored in system ROM 143, writes an image capture enable signal to image sensor chip 182 via communication line 151. Line 151, like the remainder of communication lines described herein represents one or more physical communication lines. In the embodiment shown, wherein image sensor chip 182 is of a type available from IC Media Corp., I²C interface 115 of chip 180 is utilized to facilitate communication with chip 182 (if another image sensor chip is selected another type of interface e.g. interface 116 may be utilized). Other types of signals may be sent over line 151 during the course of image capture. Line 151 may carry, for example, timing initialization, gain setting and exposure setting signals.

When control block 135 of image sensor chip 182 receives an image capture enable instruction, control block 135 sends various signals to frame grabber block 148. Image sensor control block 135 typically sends various types of synchronization signals to frame grabber block 148 during the course of capturing frames of image data. In particular, control block 135 may send to frame grabber block 148 "start of frame signals" which inform frame grabber block 148 that chip 182 is ready to transmit a new frame of image data, "data valid window" signals which indicate periods in which a row of image data is valid and "data acquisition clock" signals as established by clock 137 controlling the timing of image data capture operations. In the embodiment described, line 152 represents three physical communication lines, each carrying one of the above types of signals. In an alternative embodiment, vertical and horizontal synchronization signals are processed by frame grabber 148 to internally generate a data valid window signal. Frame grabber block 148 appropriately responds to the respective synchronization signals, by establishing buffer memory locations within integrated RAM 149 of block 148 for temporary storage of the image data received from image sensor chip 182 over data line 159. At any time during the capture of a frame of image data into system RAM 142, buffer RAM 149 of frame grabber block 148 may store a partial (e.g about 0.1 to 0.8) or a full line of image data.

Referring to further aspects of electrical circuit 100, circuit 100 includes a system bus 150. Bus 150 may be in communication with CPU 141 via a memory interface such as EIM interface 117 of IC chip 180. System RAM 142 and system ROM 143 are also connected to bus 150 and in communication with CPU 141 via bus 150. In the embodiment shown, RAM 142 and ROM 143 are provided by discreet IC chips. System RAM 142 and system ROM 143 could also be incorporated into processor chip 180.

In addition to having system RAM 142, sometimes referred to as "working" RAM, electrical circuit 100 may include one or more long term storage devices. Electrical circuit 100 can include for example a "flash" memory device 120. Several standardized formats are available for such flash memory devices including: "Multimedia" (MMC), "Smart Media," "Compact Flash," and "Memory Stick." Flash memory devices are conveniently available in card structures which can be interfaced to CPU 141 via an appropriate "slot" electromechanical interface in communication with IC chip 180. Flash memory devices are particularly useful when reader 5 must archive numerous frames of image data. Electrical circuit 100 can also include other types of long term storage such as a hard drive which may be interfaced to bus 150 or to an appropriate I/O interface of processor IC chip 180.

In a further aspect of electrical circuit 100, control circuit 140 is configured to control the turning off and turning on of LEDs 16, 18 of illumination block 160. Control circuit 140 preferably controls illumination block 160 in a manner that is coordinated with the capturing of the frames of image data. Illumination LEDs 16 are typically on during at least a portion of frame capture periods. Configuring circuit 140 so that LEDs 16, 18 have off periods significantly reduces the power consumption of circuit 100.

In a further aspect of the electrical circuit 100, electrical circuit 100 can be configured so that PWM output interface 114 of IC chip 180 controls illumination LEDs of an imaging module such as illumination LEDs 16 of module 10-1 or aiming/illumination LEDs 18 of module 10-2.

In one embodiment, illumination block 160 is in communication with PWM output interface 114 and configured in such manner that LEDs 16 are turned on at a leading edge of PWM pulses output at PWM interface 114, and are turned off at falling edges of PWM pulses output at PWM interface 114. PWM interface 114 should be configured so that several pulses are generated and sent over communication line 153i during the time that a single row of pixels of image data are exposed to light prior to clocking out of pixel values corresponding to that row. Thus, illumination LEDs 16 would be turned on and off several times during the exposure period for exposing a row of pixels to light. Further, the number of pulses output by PWM output 114 during the time that a single row of pixels are exposed should not vary substantially from row to row. The pixel clock signal received at frame grabber block 148 of IC chip 180 can be utilized to generate the PWM output. It can be seen, therefore, that multifunctional IC chip 180 including frame grabber block 148 and PWM output 114 greatly simplifies the task of developing PWM signals for use in controlling illumination LEDs 16 of module 10.

In another embodiment, PWM output 114 and illumination block 160 are configured so that PWM output 114 controls the intensity of illumination, not the on time/off time of illumination. Illumination LED block 160 in such an embodiment can include a power supply circuit which is interfaced to PWM output 114 such that the PWM signal output at PWM output 114 varies the voltage or current supplied to LEDs 16.

In a further aspect of electrical circuit 100, aiming LEDs 18 of circuit 100 can be controlled by a signal transmitted by a general purpose I/O port 116 of IC chip 180 over communication line 153a. Multifunctional processor IC chip 180 can be programmed so that an aiming LED control signal 168, as is shown in the timing diagram of FIG. 2g, is caused to change to an "on" state when frame grabber block 148 completes the process of capturing a complete frame of image data. In the time line of FIG. 2g, frame exposure periods P1, P2, and P3 are plotted against an aiming LED control signal 168. Frame grabber block 148 may be configured to generate an "end of acquisition" or "end of frame" signal when frame grabber block 148 completes the process of capturing a complete frame of image data into RAM 142. When CPU 141 receives an "end of acquisition" signal, CPU 141 controls I/O port 116 to change the state of LED control signal 168. Control circuit 140 may also change the state of LED control signal 168 when generating a start of frame signal. As indicated by the time line of FIG. 2g, control circuit 140 may execute a delay prior to changing the state of signal 168. Control circuit 140 is programmed so that LED control signal 168 remains in an "ON" state known to be sufficiently short duration so as not to cause actuation of an aiming LED 18 during a succeeding frame exposure period. Configured in the manner described, aiming LEDs 18 are selectively pulsed on for a short duration during intermediate successive frame exposure periods, e.g. frame exposure periods P1 and P2.

Referring now to FIG. 2b, electrical circuit 101 is described. Electrical circuit 101 controls operation of a single imaging module optical reader comprising a low cost 1D CCD image sensor 32 incorporated on IC chip 183. Image sensor 32 of FIG. 2b may be provided for example by a Toshiba Model TCD 1304 AP linear image sensor. Further aspects of an exemplary 1D imaging module are described, for example, in application Ser. No. 09/658,811, filed Sep. 11, 2000, entitled "Optical Assembly for Barcode Scanner," incorporated herein by reference.

Referring to aspects of electrical circuit 101 in detail, electrical circuit 101 includes a control circuit 140 which, like control circuit 140 of circuit 100 is partially incorporated in a multifunctional processor IC chip 180 including CPU 141 and a frame grabber block 148. Control circuit 140 of circuit 101 further includes system RAM 142 system ROM 143 and supplementary central processor unit (CPU) 147, integrated on processor IC chip 179. System RAM 142 and system RAM 143 are in communication with EIM interface 117 of IC chip 180 via bus 150.

Processor IC chip 179 provides control and timing operations similar to that provided by electrical block 134 of image sensor chip 182 described in FIG. 1a. Processor IC chip 179, in general, sends synchronization signals and digital clocking signals to IC chip 180, and sends digital clocking signals to A/D conversion circuit 136 and image sensor 32. Processor IC chip 179 of circuit 101 may be a relatively low power processor IC chip such as an 8 BIT Cyprus PSOC CY8C26Z33-24PZI Microcontroller processor IC chip.

Aspects of the operation of IC chip 179 in during the course of capturing slice image data will now be described in detail. When trigger 13t is pulled, CPU 141 transmits enable image capture instructions over communication line 151. In response to receipt of an image capture enable instructions received from chip 180, processor IC chip 179 performs a variety of operations. Via communication line 152, processor IC chip 179 may send synchronization signals, such as "start of scan," "data valid window," and "data acquisition clock" signals to frame grabber block 148. Processor IC chip 179 may also send timing signals and digital clocking signals (e.g. master clock, integration clear gate, and shift gate pulse) to image sensor 32. Processor IC chip 179 typically also transmits a master clock signal to A/D conversion circuit 136. Referring to further aspects of IC chip 180 of circuit 101, CPU 141 of chip 180, may also send e.g. gain setting, exposure setting, and timing initialization signals via line 151 to IC chip 179. Communication between IC chip 180 and IC chip 179 may be made via an SPI interface or I/O interface 116 of chip 180 and chip 179.

As will be explained with reference to circuit 104, shown in FIG. 2e, processor IC chip 179 may be replaced by a programmable logic circuit, e.g. a PLD, CPLD, or an FPGA. IC chip 179 could also be replaced by an ASIC. Electrical circuit 101 of FIG. 2b, includes what may be termed a "digital digitizer" in that analog voltage levels transmitted by CCD image sensor 32 on line 155 are converted into gray scale pixel values by A/D converter 136 and transmitted via line 159 to frame grabber block 148. Circuit 101 could also include an analog digitizer which processes an analog signal generated by image sensor 32 to generate a two-state output signal that changes state in accordance with light-to-dark and dark-do-light transitions of the image sensor analog output signal.

Processor IC chip 179 also controls LED bank 160. LED bank 160 of a 1D image sensor reader typically includes a single bank of LEDs which simultaneously illuminates a target area and provides an aiming pattern facilitating aligning of the reader with a target indicia. LEDs 18 of 1D imaging module 10-2 like LEDs 16 of module 10-1 can be pulsed so as to reduce energy consumption by LEDs 18.

Electrical circuit 100 and electrical circuit 101 form a family of 1D and 2D optical readers electrical circuits, which may be manufactured by a single manufacturing entity wherein both of the 1D and 2D readers include the same main processor chip, namely, multifunctional processor IC chip 180. Multifunctional processor IC chip 180 of circuit 100 and circuit 101 can both be provided by e.g. a Dragonball IC chip or an Anaconda IC chip of the type available from Motorola, Inc. Multifunctional processor IC chip 180 of electrical circuit 101 includes far more processing power than is necessary to provide the functionality of a 1D optical reader. Nevertheless, the inventors discovered that the overall cost of electrical circuit 101 would be reduced by incorporating frame grabbing multifunctional IC chip 180 in circuit 101 in that such incorporation reduces overall engineering cost relative to that which would ensue from the development of two different 1D and 2D electrical circuits comprising two different main processor types.

Various electrical circuit architectures for operating a reader having more than one imaging module 10 are shown in FIGS. 2c–2f.

Figure 2C:
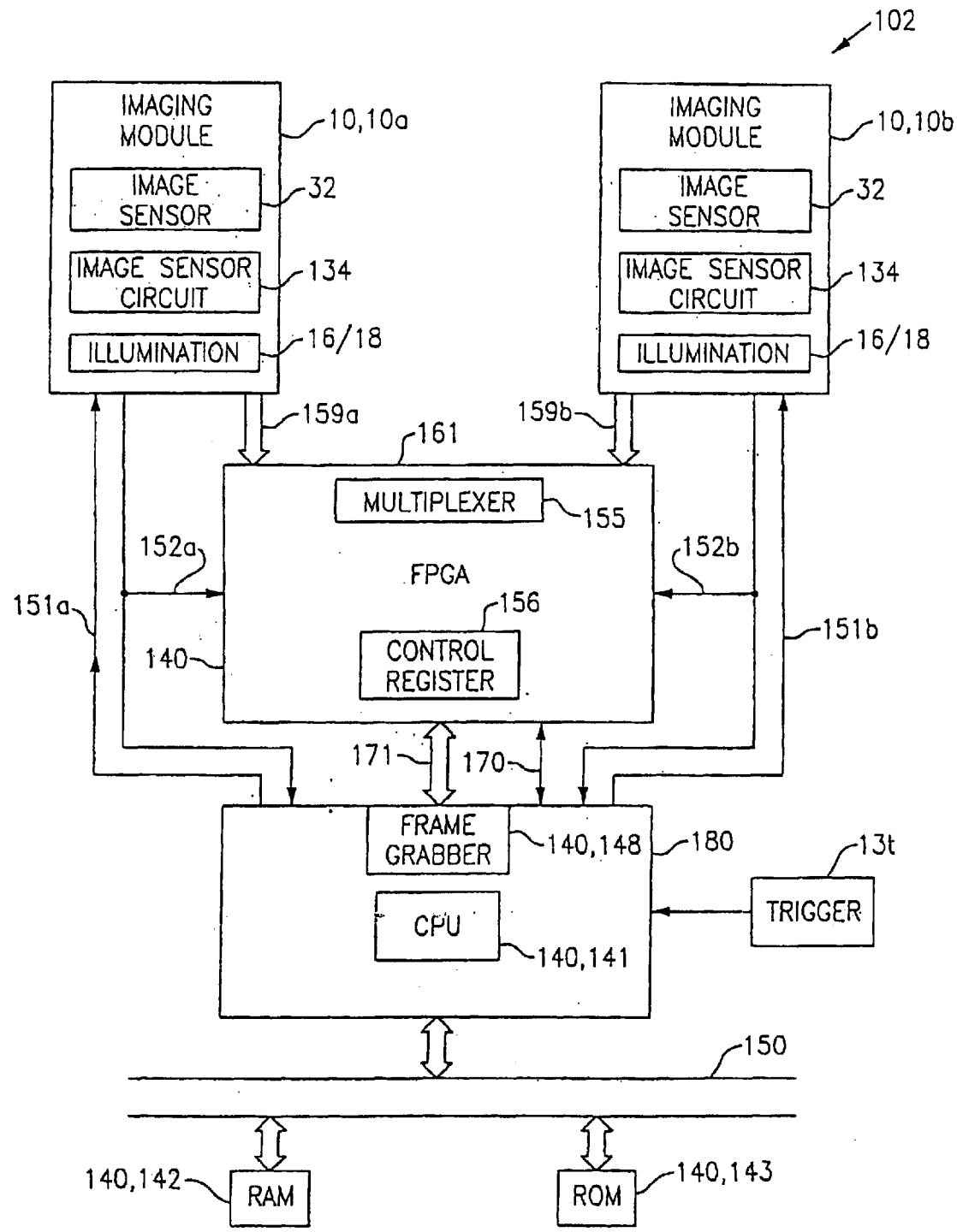

In the architecture of FIG. 2c, electrical circuit 102 includes a pair of imaging modules 10 and a control circuit 140. Control circuit 140 includes a field programmable gate array (FPGA) 161, a multifunctional processor IC Chip 180 including a CPU 141 and frame grabber block 148, a system RAM 142 and a system ROM 143. Processor IC chip 180 may be, for example, a Dragonball or Anaconda processor chip of the type available from Motorola, Inc. Imaging modules 10a and 10b shown in block form in FIG. 2c correspond to the physical 2D imaging module 10-1 shown in FIGS. 3a–3c. System RAM 142 and system ROM 143 are in communication with processor IC Chip 180 via system bus 150. In general, FPGA 161 of circuit 102 is programmed to execute a multiplexer function indicated by block 155. In response to module select signals received from multifunctional processor IC chip 180, multiplexer 155 receives image data over one of data lines 159a, 159b from a selected one of module 10a and module 10b and sends the data to frame grabber block 148 of processor IC chip 180. Multiplexer 155 can be deleted if imaging modules 10 are selected to include image sensor IC chips which generate high impedance (tri-statable) synchronization signals when not actuated. FPGA 161, like all other FPGAs described herein could be replaced by another programmable circuit such as a programmable logic device (PLD), or a complex programmable logic device (CPLD) or another device such as an ASIC or processor chip (e.g. such as chip 179 or chip 180).

Referring to the operation of electrical circuit 102 in further detail, processor IC chip 180 sends an image capture enable signal to FPGA 161 via line 170 when trigger 13t is actuated and to an appropriate one of modules 10a and 10b via one of lines 151a, 151b. The selected module, 10a or 10b, then sends synchronization signals, and the digital clocking signals as described previously to FPGA 161 and IC chip 180, over the appropriate one of lines 152a, 152b.

FPGA 161 transmits image data to multifunctional processor IC Chip 180 over data line 171 which in turn transmits image data to RAM 142 over system bus 150. Lines 151a, 151b may carry PWM interface illumination control signals as described previously in connection with electrical circuit 100.

Figure 2D:
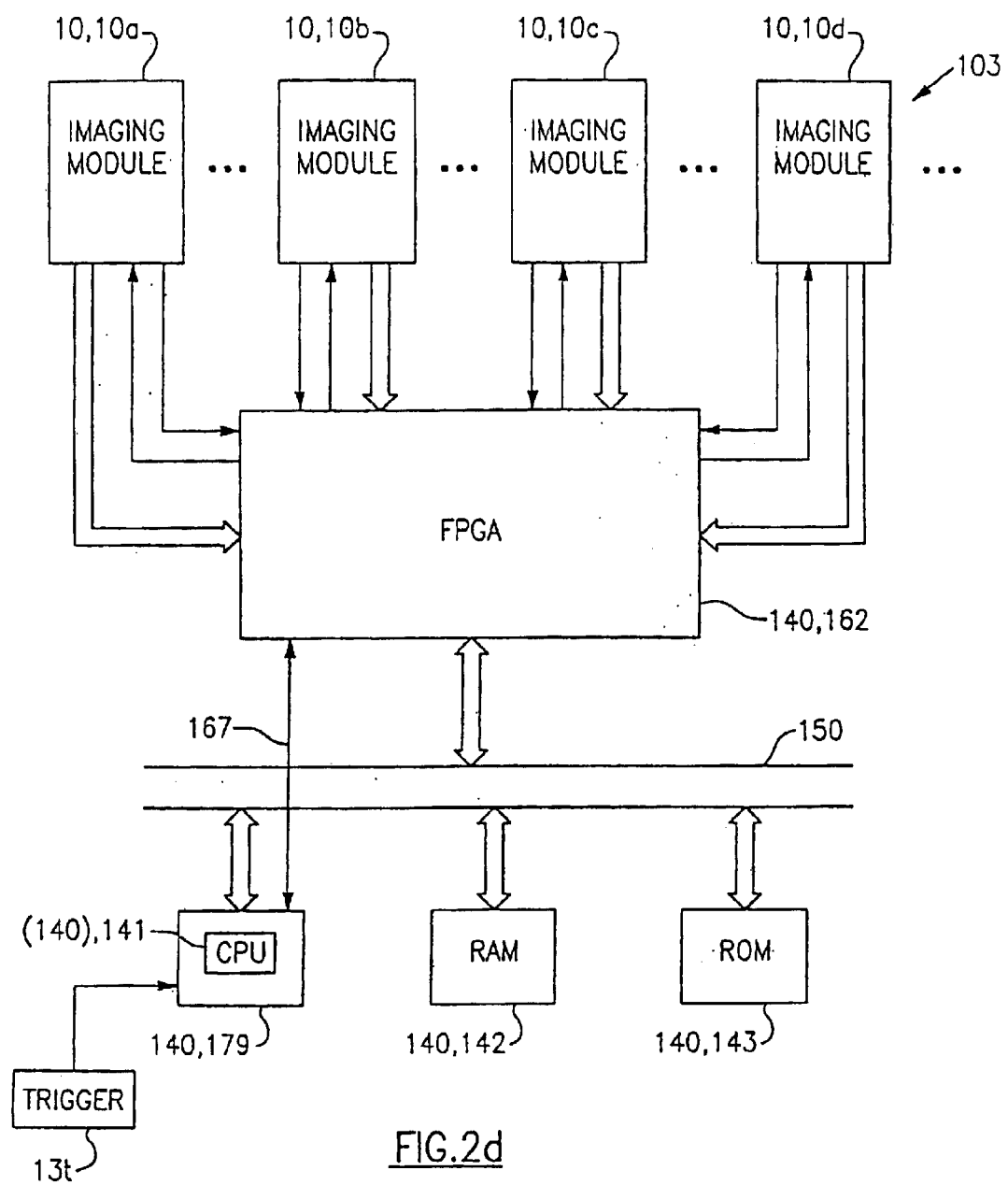

In the architecture of FIG. 2d, electrical circuit 103 includes a plurality of N imaging modules 10, which may be incorporated in a single housing 7. Electrical circuit 103 includes a control circuit 140 having an FPGA 162, a processor IC Chip 179, a system RAM 142 and a system ROM 143. FPGA 162 is in communication with processor IC Chip 179 via system bus 150. Processor IC chip 179 and FPGA 162 are also in communication via bus arbitration communication line 167 which carries bus hand shaking (e.g. bus request, bus grant) signals.

Various embodiments of FPGA 162 are described with reference to FIGS. 2h and 2i. In the embodiment of FIG. 2h, FPGA 162c is programmed to include multiplexer block 162m, control register 162c, and a solitary frame grabber block 162f. Image capture enable signals for actuating image capture via one of modules e.g. 10a are received at control register 162 in response to an actuation of trigger 13t. Control register 162c on receipt of an image capture enable signal sends the image capture enable signal to the selected one module 10 and utilizes the signal to associate frame grabber block 162f to the selected module e.g. 10a. It will be understood that control register 162c can be adapted to send during one type of frame capture method, e.g. illumination actuation signals to a second imaging module, 10c while actuating an image sensor 32 of a first module, e.g. 10a without sending illumination actuation signals to first module 10a.

Figure 2E:
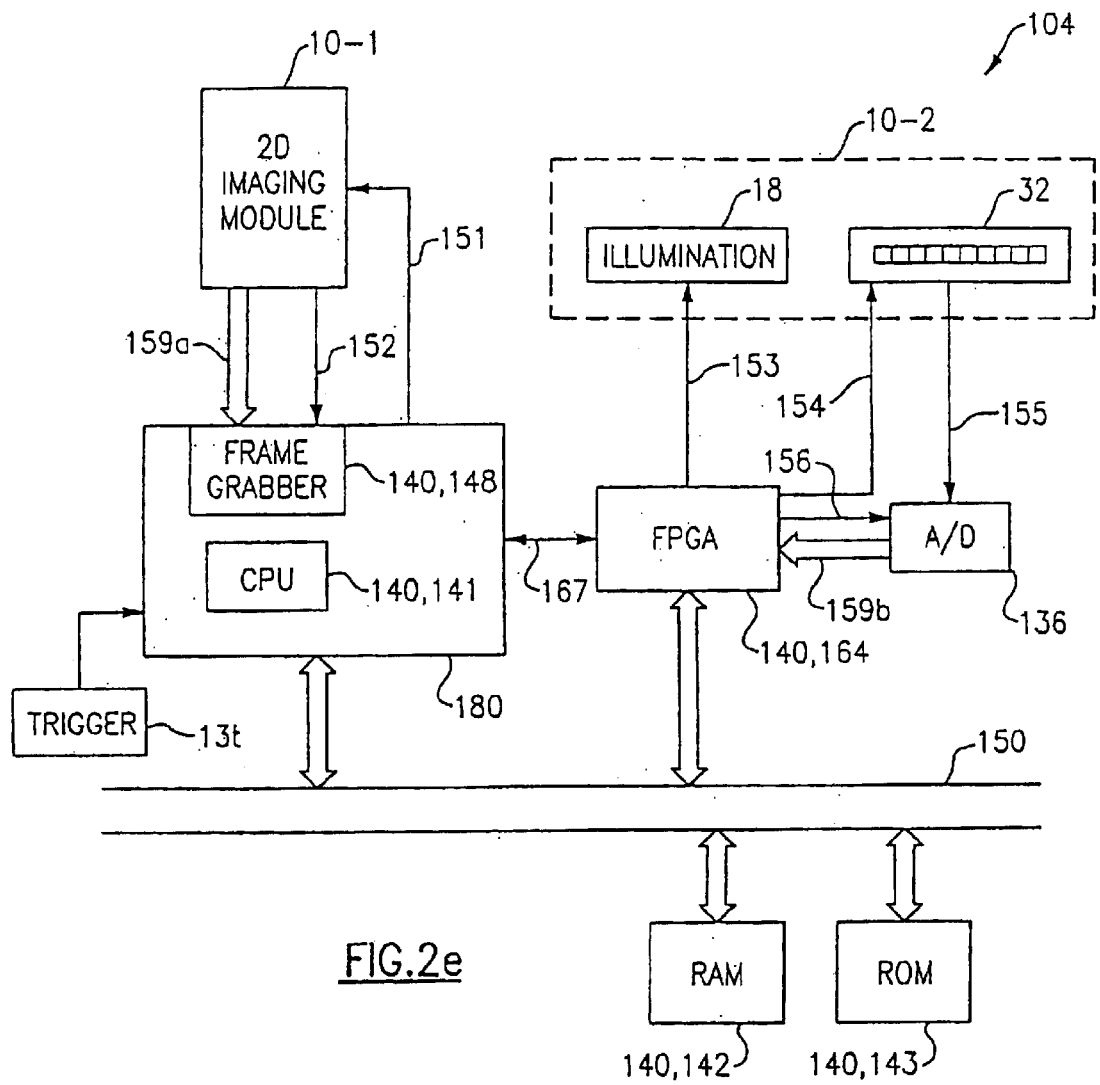
Figure 2J:
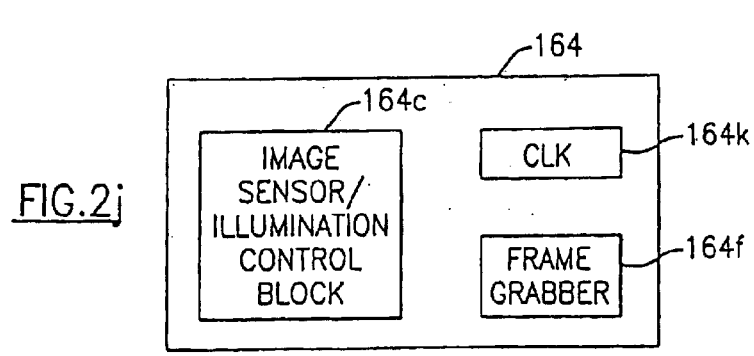
FIG. 2j is an electrical block diagram illustrating an FPGA as shown in FIG. 2e.
Figure 2H:
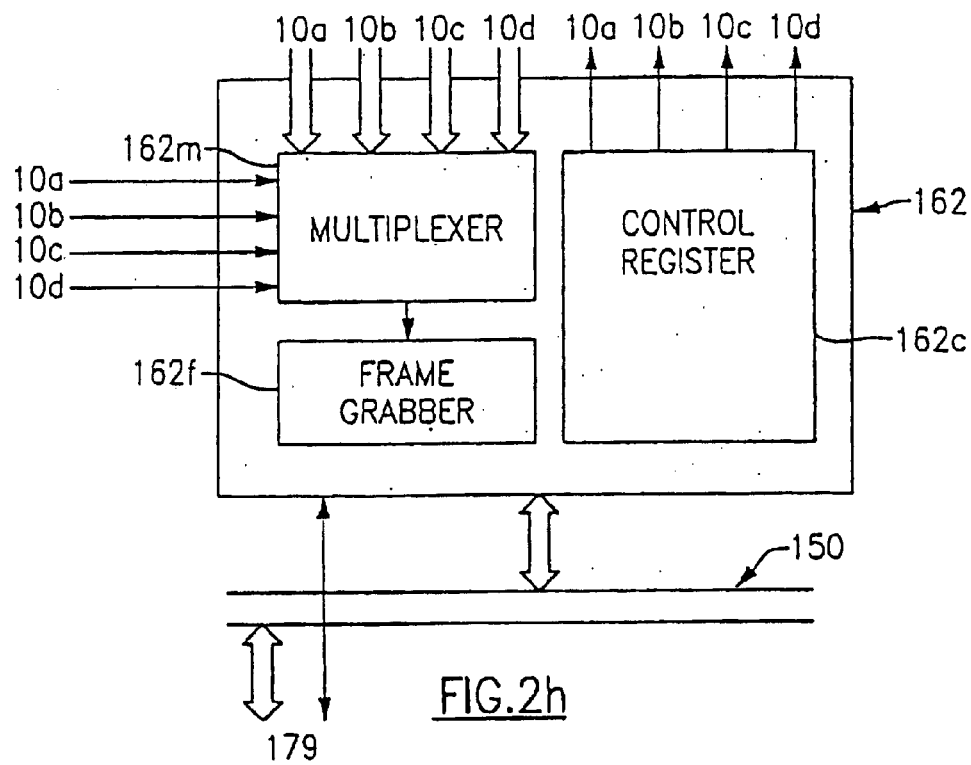
FIGS. 2h and 2i are electrical block diagrams illustrating exemplary embodiments of an FPGA as shown in the block diagram of FIG. 2d.
Figure 2I:
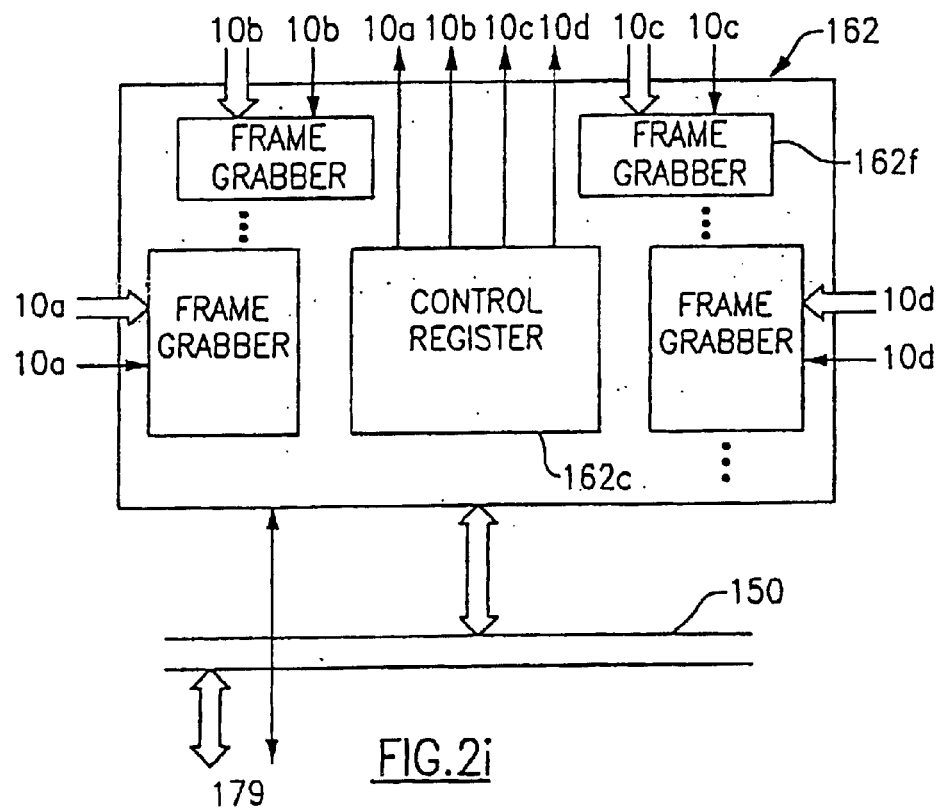

In the embodiment of FPGA 162 illustrated in FIG. 2i, multiplexer block 162m is deleted. FPGA 162 of FIG. 2i includes N frame grabber blocks 162f. With use of FPGA 162 configured as shown in FIG. 2i, electrical circuit 103 can be operated to capture several frames of image data contemporaneously by contemporaneous actuation of each of several imaging modules e.g. 10a and 10c.

Referring to further aspects of electrical circuit 103, of FIG. 2d processor IC chip 179 can be provided by general purpose processor IC chip such as a Power PC IC chip of the type available from Motorola. Other suitable IC chips for providing the function of IC chip 179 of circuit 103 include, for example, an Intel SA1110 chip and an Xscale family of processor IC chips, also available from Intel.

Referring now to FIG. 2e, electrical circuit 104 controls a pair of imaging modules wherein a first imaging module 10-1 is a 2D imaging module and a second imaging module 10-2 is a 1D imaging module. Control circuit 140 includes CPU 141, 2D frame grabber block 148, FPGA 164, system RAM 142 and system ROM 143. Frame grabber block 148 and CPU 141 are both incorporated on multifunctional processor IC chip 180 (e.g. a Motorola Dragonball IC chip), as described previously in connection with FIG. 2a. A main program executed by CPU 141 of multifunctional processor IC chip 180 controls operation of both first imaging module 10-1 and second imaging module 10-2.

For capture of a 2D image, processor IC chip 180 in response to actuation of trigger 13t sends an image capture enable signal to module 10-1 via a communication line 151. During image capture, 2D imaging module 10-1 sends synchronization and digital clocking signals to frame grabber block 148 via communication line 152 which as explained previously and like all lines represented herein may represent a plurality of physical lines. Further, 2D imaging module 10-1 sends digitized image data to frame grabber block 148 via data line 159a. Processor IC chip 180 stores image data in RAM 142 by writing image data stored in buffer memory locations of frame grabber block 148 to RAM 142 via system bus 150. An illumination control signal communication line is also typically interposed between IC chip 180 and module 10-1. An illumination signal communication line can be considered to be represent by line 151.

For capture of a 1D "slice" image representation, processor IC chip 180 sends a 1D image capture enable signal to FPGA 164 via system bus 150. Processor IC chip 180 and FPGA 164 are further in communication via communication line 167 which carries bus handshaking (e.g. bus request and bus grant) signals. On receipt of an image capture enable signal from processor IC chip 180, FPGA 164 sends digital clocking signals to A/D converter 136 via line 156, to image sensor 32 via line 154, and illumination control signals to illumination LEDs 18 as shown in the physical form view of FIG. 3e via line 153. Image sensor 32 sends analog image signals to A/D converter 136 via output line 155 and A/D converter 136 in turn converts the signals into N (typically 8) bit grey scale pixel values. A/D converter 136 sends the digitized image data to FPGA 164 which stores the image data to RAM 142.

As indicated by the block diagram of FIG. 2j, FPGA 164 of electrical circuit 104 includes frame grabber block 164f for fast transfer of image data into system RAM 142, image sensor illumination and control block 164c for controlling LEDs 18 and for developing synchronization signals, and clock 164k for generating digital clocking pulses.

Another electrical circuit for controlling a plurality of imaging modules is described with reference to FIG. 2f. Electrical circuit 105 includes a pair of frame grabbing FPGAs 165, 166. First FPGA 165 is dedicated for frame capture of image data generated by first imaging module 10a while second frame grabbing FPGA 166 is dedicated for capture of image data generated by second imaging module 10b. The architecture of FIG. 2f is especially well suited for contemporaneous capture of multiple frames of image data via contemporaneous actuation of image sensors of two separate imaging modules 10a and 10b.

Control circuit 140 of electrical circuit 105 includes CPU 141 which may be incorporated on a general purpose 32 bit processor IC chip 179, frame grabbing FPGAs 165 and 166, system RAM 142 and system ROM 143. Processor IC chip 179 may transmit image capture enable instruction via communication lines 151a and 151b. Processor IC chip 179 may also send illumination control signals via lines 151a and 151b. For example, in a mode of operation that will be described herein processor IC chip may send an image capture enable signal to module 10a over line 151a (and an illumination disabling signal over line 151a), and an illumination control signal to module 10b over line 151b with use of a specific image capture method wherein images are captured in such a manner so as to be substantially impervious to specular reflection decode failures.

In a further aspect of electrical circuit 105, imaging modules 10a and 10b send synchronization and digital clocking signals to FPGAs 165 and 166 respectively, via lines 152a and 152b, and image data to FPGAs 165 and 166 respectively over, data lines 159a and 159b. Processor IC chip 179 is in communication with frame grabbing FPGAs 165 and 166 via system bus 150 and via bus arbitration communication lines 167a and 167b over which bus handshaking signals (e.g. bus request, bus grant) are sent. While the invention in a major aspect relates to optical readers having multiple imaging modules, another commercial optical product according to another aspect of the invention is described with reference to FIGS. 5a–5e.

In FIG. 5a an optical reader is shown having an electrical circuit 100 as described in FIG. 2a wherein an imaging module 10 is incorporated on a compact flash card 510. Compact flash card 510 carrying circuit 100 as will be explained herein may be interfaced with a host processor assembly such as a personal data assistant (PDA) 540 or a personal computer (PC) 550.

As best seen in FIG. 5c or 5d, PDA 540 can include a compact flash slot 544 for receiving a compact flash card 510, which incorporates an imaging module 10.

Various features of compact flash card 510 incorporating module 10 are described with reference to FIG. 5a. As seen in FIG. 5a, electrical circuit 100 including multifunctional frame grabbing IC chip 180, system RAM 142, and system ROM 143 are incorporated on compact flash card 510 which further carries imaging module 10. Imaging module 10 may be a 2D imaging module as described with reference to FIGS. 3a–3c, or a 1D module, e.g. as described with reference FIG. 3e. Card 510 typically further comprises a protective cover (not shown).

Compact flash card 510 including electrical circuit 100 as indicated by block diagram FIG. 5b, is interfaced to a host processor system 68. As will be explained further herein, host processor system 68 can be included in e.g. a personal data assistant (PDA) 540 as shown in FIG. 5b or a personal computer (PC) 550 as shown in FIG. 5e.

Referring to further aspects of the block diagram of FIG. 5b, circuit 515 includes FPGA 520 which facilitates communication between electrical circuit 100 and host system 68. A physical form view of FPGA 520 is shown in physical form diagram of FIG. 5a. FPGA 520 may be programmed to perform a variety of functions. FPGA 520 may be programmed to (1) communicate with host 68 to inform host 68 that compact flash card 510 is connected to host 68 when it is first connected, (2) to perform all compact flash bus timing, and (3) to provide all buffer interfaces required to receive from circuit 100 data in a form supported by electrical circuit 100 and to allow that data to be received in a compact flash format as is required by host 68.

FPGA 520 can be connected via a communication line 504 to UART interface 108 of multifunctional processor IC chip 180. UART interface 108 may transmit data in e.g. an RS 232 format while FPGA 520, appropriately programmed, converts that data into a compact flash format. Further connected to FPGA 520 via line 526 is a compact flash female connector 530, which is formed on an edge of compact flash card 510, and comprises a plurality of sockets 530s as indicated in the exploded section view of FIG. 5a.

Compact flash card 510 including an electrical circuit 100 having imaging module 10 can operate in a first integrated mode or a second "free-standing" which in one specific embodiment can be considered a "tethered" mode. An integrated mode of operation of card 510 is described with reference to FIGS. 5c and 5d. In an integrated mode, card 510 is integrated into a device such as a PDA 540. To electrically and mechanically connect card 510 to a host, device female end 530 is connected to male end compact flash connector 531, comprising a plurality of pins, within a housing of the host device.

A free-standing mode of operation is illustrated with reference to FIG. 5e. In a free-standing mode of operation, compact flash card 510 including module 10 is positioned in a position spaced apart from a host device e.g. device 550. Compact flash card 510 may rest on a table top or else may be mounted to a fixed member spaced apart from the host device e.g. PC 550. In a free-standing mode, card 510 may be connected to a host device via a flexible cable connector 560. When card 510 is connected to a host assembly via a flexible connector, card 510 may be considered to be operating in a "tethered" mode. Card 510 may also be wirelessly connected to a host via e.g. a RF link. In the embodiment of FIG. 5e cable connector 560 is interfaced to host device 550 on one end and to compact flash card 510 on another end. Cable connector 560 includes male compact flash connector 531 for facilitating communication between connector 560 and card 510. Card 510 can further include feet 565 of height substantially the same as connector 531 disposed on an under surface thereof so that card 510 can rest substantially horizontally on a table surface when operating in a free-standing mode. Host device 550 in the free-standing mode diagram illustrated by FIG. 5e is shown as a PC. It will be understood that a host device in a free-standing mode could also be provided by PDA 540 or another mobile or non-mobile computer device.

The multiple-module electrical circuits 102, 103, 104, and 105 described herein can be implemented for operation of imaging modules spread out over several housings or for operation of imaging modules incorporated in a housing 7 of multiple imaging module reader 5-1, 5-2, 5-3, 5-4, 5-5, 5-6, and 5-7, 5-8 and 5-9 as shown in physical form views 1a–1m.

Additional aspects of electrical circuits which may be used with the invention are described in Ser. No. 60/470,016, filed May 12, 2003, incorporated by reference and U.S. application Ser. No. 10/339,439, filed Jan. 9, 2003 is also incorporated by reference.

Methods for operating a multiple imaging module optical reader according to the invention will now be described in greater detail. Flow diagrams of FIGS. 4a–4c illustrate operation of a multiple imaging module optical reader having at least two imaging modules 10a, 10b.

In the reader methods described herein "actuation of an image sensor" generally refers to at least one step in the process of sending appropriate signals to an image sensor 32 to cause exposure of image sensor pixels image sensor to light and to cause clocking out of electrical signals corresponding to light received at pixels of the array. These steps are described in greater detail in for example, U.S. application Ser. No. 09/766,922, filed Jan. 22, 2001, entitled "Optical Reader Having Reduced Parameter Determination Delay," incorporated herein by reference. "Actuation of illumination" herein generally refers to the step of sending electrical current to a light source e.g. 16, 18 to turn on the light source.

Figure 4A:
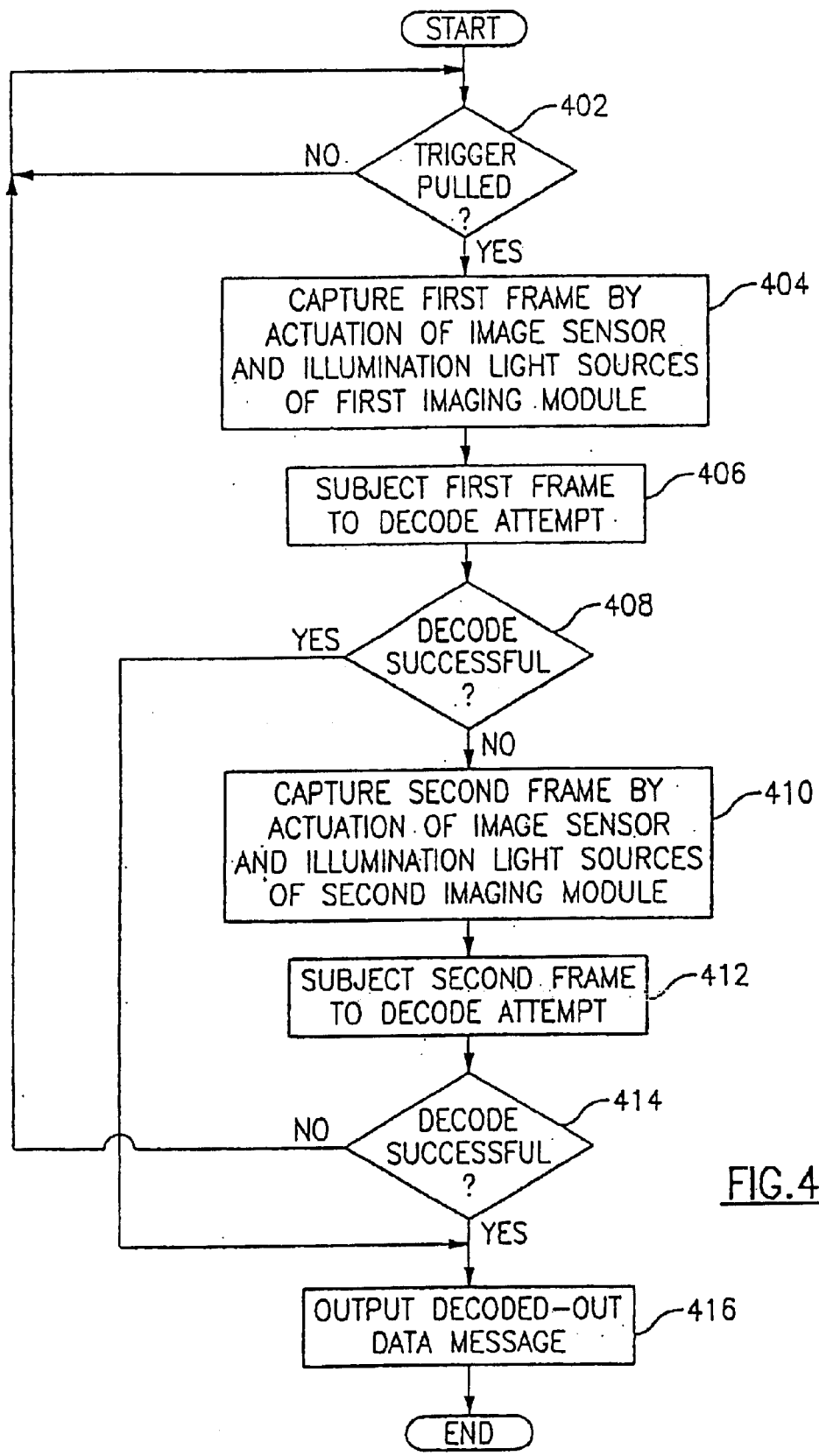
FIGS. 4a–4c are flow diagrams illustrating exemplary control methods which may be incorporated in a multiple imaging assembly reader according to the invention.
Figure 4B:
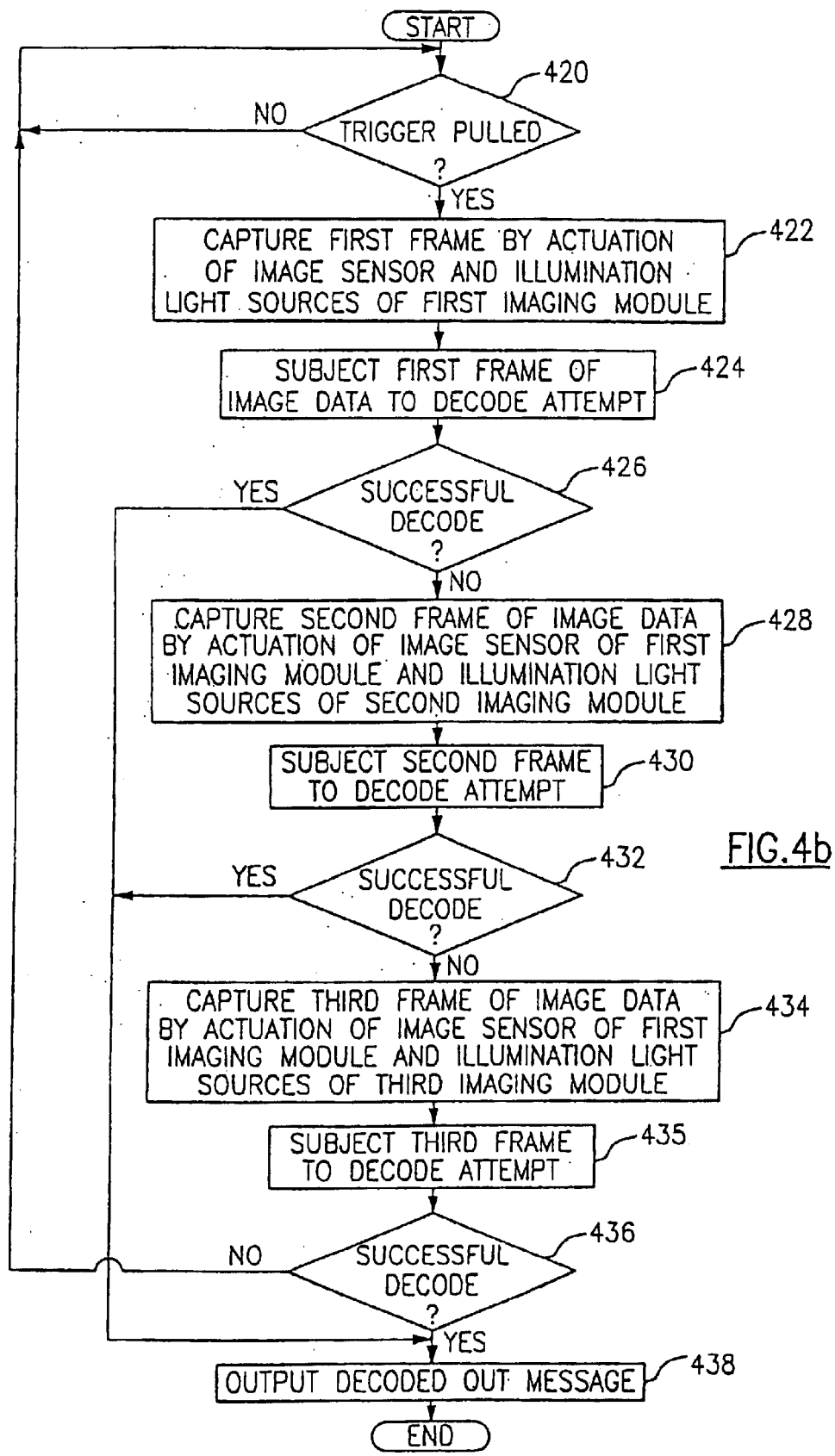
Figure 4C:
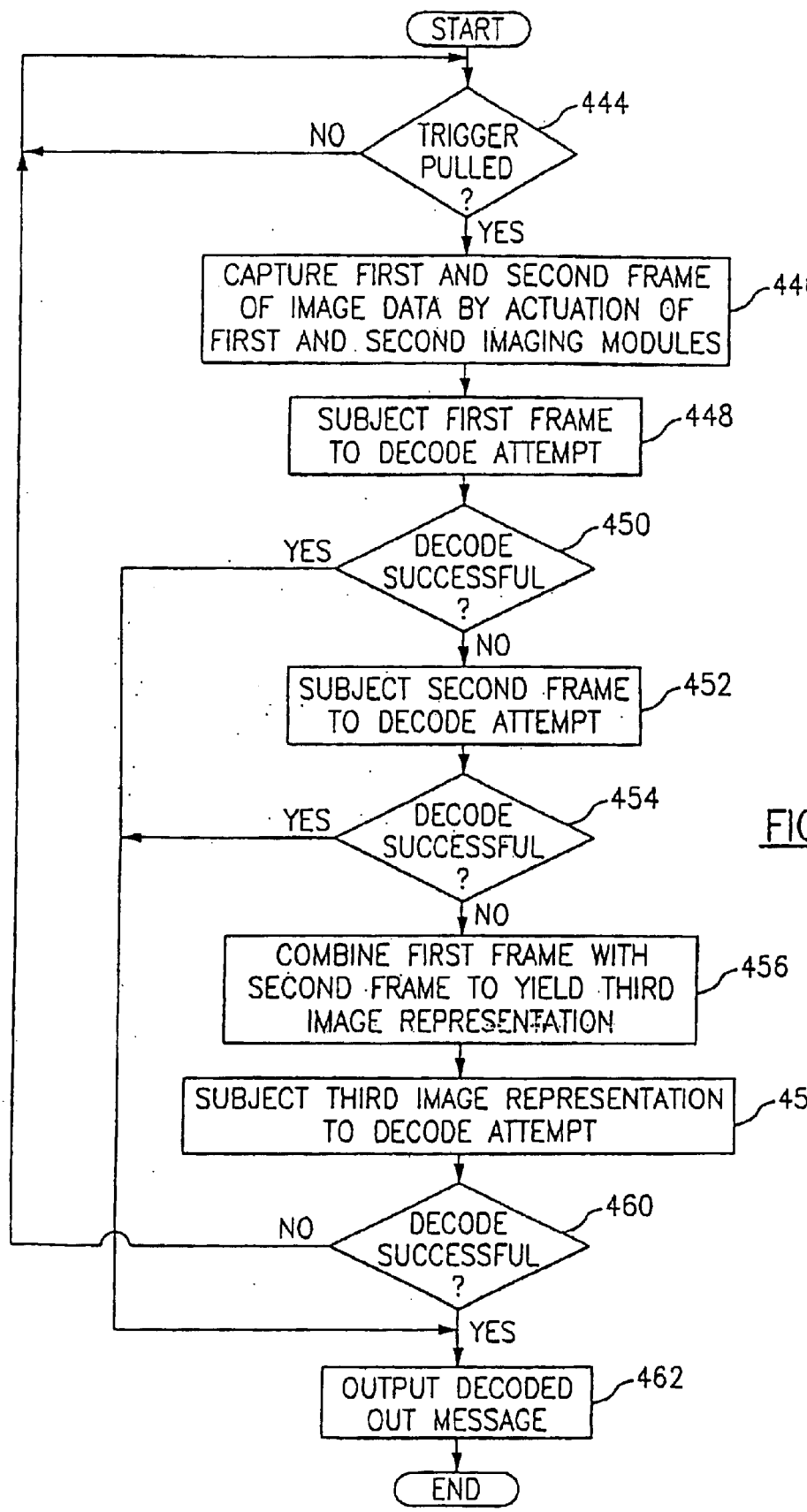

Referring to the reader operating method of FIG. 4a, at block 404 after a trigger 13t is pulled (block 402) control circuit 140 actuates image sensor 32 of first imaging module 10a and illumination light sources 16 of first imaging module 10a during a frame capture period in which a first frame of image data is captured. At block 406 control circuit 406 subjects the first captured frame of image data to a decode attempt. If the decode attempt is not successful (block 408), control circuit 140 executes block 410 to capture a second frame of image data. Control circuit 140 actuates image sensor 32 and illumination light sources 16 of second imaging module 10b when capturing a second frame of image data. Instead of capturing a second frame of image subsequent to subjecting a first frame to a decode attempt (406) control circuit 140 can capture a second frame as described in connection with block 410 prior to the decode attempt of block 406. Control circuit 140 can capture a first frame as described in connection with block 404 and a second frame as described in connection with block 410 in any order and can capture the frames contemporaneously. At block 412 control circuit 140 subjects the indicia representation of the second frame to a decode attempt, and at block 410 outputs a decoded out data message if decoding is successful (block 414). The attempt to decode a decodable indicia may be in accordance with a method for decoding decodable indicia such as are described in U.S. application Ser. No. 09/904,697, filed Jul. 13, 2001, entitled "Applying a Color Imager To A Hand Held Reader For Indicia Reading Image Capture," incorporated by reference. The reader control method described with reference to the flow diagram of FIG. 4a is highly useful wherein specular reflection decode failures can be expected. Referring to the example of two module reader 5-1 shown in FIGS. 1a and 1b note that if there may be a specular reflection decode failure when a first frame corresponding to a mirrored planar surface is captured via actuation of first module 10a then there likely will not be a specular reflection decode failure when a second frame captured via actuation of second module 10b is subjected to decoding.

A "wait for trigger pull" control loop, as described in connection with block 402, FIG. 4a, block 420, FIG. 4b, block 444, FIG. 4c will now be described in greater detail. When a trigger 13t of reader 5 is actuated, control circuit 140 generates a trigger signal to cause branching of program control as described in FIGS. 4a, 4b, and 4c. According to the invention, a trigger signal can also be generated automatically in response to a decodable indicia being presented in a field of view of a module of reader 5. A method of automatically generating what can be considered a trigger signal based on detected edge transitions without a physical trigger pull is described in co-pending application Ser. No. 09/432,282, filed Nov. 2, 1999, entitled "Indicia Sensor System for Optical Reader," incorporated by reference. It will be understood that any of the control loops indicated by blocks 402, 420, and 440 can be substituted for by a control loop wherein control circuit 140 waits for trigger signal automatically generated when a decodable indicia 15 moved into a filed of view of a module of reader 5.

In one possible variation of the invention, first and second imaging modules 10a, 10b, and possibly all N modules of an N imaging module optical reader are configured so that each module has a different best focus distance. For example, module 10c of reader 52 can be configured to a best focus distance of about 3 inches, module 10a can be configured to have a best focus distance of about 6 inches, while module 10b can be configured to have a best focus distance of about 9 inches. In another example, one dimensional imaging module 10a of reader 5-10 (FIG. 1k) can have a best focus distance at least one inch longer or shorter than a best focus distance of two dimensional imaging module 10b of reader 5-10. It will be seen that configuring a reader of the invention so that each of the modules has a different best focus distance increases the overall depth of field of the reader.

A multiple module reader of the invention wherein each module has a different best focus distance can be operated in accordance with the flow diagram of FIG. 4a to the end that the reader automatically reads target indicia disposed at a wide range of reader-to-target distance. If an object being read is disposed at a distance closer to the best focus distance of a second module but a substantial distance from a best focus distance of a first module, the reader operating in accordance with the flow diagram of FIG. 4a may successfully decode the indicia at block 412 (second frame decode attempt) after failing to decode the indicia at block 406 (first frame decode attempt).

While block 404 of the flow diagram of FIG. 4a and other operating blocks herein refers to capturing a "first" frame of image data, it will be understood that a "first" captured frame as referred to herein is not necessarily the initial frame captured by a reader subsequent to actuation of trigger 13t. For example, as explained in application Ser. No. 09/766,922, filed Jan. 22, 2001, entitled "Optical Reader Having Reduced Parameter Determination Delay," and incorporated herein by reference, optical readers commonly process one or more "test" frames of image data to establish exposure levels and other operating parameters. "Frame" herein refers either to a two dimensional frame of image data or a one dimensional "slice" frame of image data.

Another method for operating a multiple imaging module optical reader is described with reference to the flow diagram of FIG. 4b. After trigger 13t is pulled at block 420 control circuit 140 captures a first frame of image data at block 422. Control circuit 140 captures a first frame image data via actuation of an image sensor 32 of first module 10a and illumination light source 16 of first imaging module 10a. That is, image sensor 32 of first module 10a is actuated to generate image signals while a target is illuminated by illumination light sources 16 of first imaging module 10a. At block 424 control circuit 140 subjects the first frame of capture image data to a decoding attempt. If decoding is not successful (block 426), then control circuit 140 automatically proceeds to block 428 to capture a second frame of image data. Control circuit 140 can also capture a second frame of image data as described in connection with block 428 prior to subjecting a first frame of image data to a decode attempt (block 424). Control circuit 140 can capture a first frame as described in connection with block 422, a second frame as described in block 428, and a third frame (block 434) in any order. Control circuit 140 can capture first, second, and third frames of image data (blocks 422, 428 and 434) contemporaneously. When control circuit 140 captures a second frame of image data at block 428 control circuit 140 once again actuates image sensor 32 of first imaging module 10*a* as in the step of block 422. However, when capturing a second frame of image data via actuation of first image sensor, control circuit 140 actuates illumination light sources 16 of second imaging module 10*b* without actuating illumination sources 16 of first imaging module 10*a*. Because image sensor 32 of first module 10*a* and illumination sources 16 of second module 10*b* are substantially spaced apart, the frame of image data captured at block 428 is substantially impervious to specular reflection read failures. The operating method described with reference to FIG. 4*b* can be utilized with any use of readers 5-1, 5-2, 5-3, 5-4, 5-5, 5-6, 5-7, 5-8, and 5-9. As indicated by block 434 a reader having three imaging modules 10*a*, 10*b*, and 10*c* e.g. of reader 5-2 can be further configured so that the control circuit 140 captures a third frame of image by actuation of image sensor 32 of first module e.g., 10*a* together with actuation of illumination light sources of third module 10*c*.

A still further method for operating an optical reader having a plurality of imaging modules is described with reference to the flow diagram of FIG. 4*c*. Referring to the flow diagram of FIG. 4*c* control circuit 140 at block 446 captures first and second frames of image data. The first frame of image data captured at block 446 may be captured via actuation of image sensor and illumination light sources of first imaging module e.g., module 10*a* of reader 503, FIG. 1*e*. The second frame of image data captured at block 446 may be captured via actuation of image sensor 32 and illumination light sources 16 of second imaging module 10*c*. Referring to further aspects of image capture block 446, control circuit 140 may capture first and second frames at block 446 sequentially (the first frame is captured in its entirety and then the second frame is captured) or contemporaneously (the capture of the second frame begins before capture of the first frame is complete). At block 448 control circuit 140 subjects the first captured frame to a decode attempt. If decoding fails, control circuit 140 proceeds to block 456 to combine the first captured frame captured by actuation of an image sensor of a first module 10*a* with a second captured frame of image data captured via actuation of a second imaging module 10*c* to generate a third image representation. At block 458 control circuit 140 subjects the third image representation derived from the first and second frames to a decoding attempt. If decoding is successful, control circuit 140 outputs the decoded out message at block 462.

At several stages of the operating methods described herein, multiple imaging module reader 5 executes the steps of attempting to decode decodable indicia and branching control of an operating program if the decoding attempt is not successful. In a further aspect of the invention, the step of attempting to decode in any one of the operating programs described with reference to FIGS. 4*a*, 4*b*, and 4*c* can be substituted for or supplemented with the step of preliminarily evaluating image data to determine whether decoding will likely be successful. A step of preliminarily evaluating image data can eliminate the need to actually launch decoding processing to determine whether indicia representation (s) within a frame of image data can be decoded.

The step of preliminarily evaluating image data to determine whether decoding will be successful can take on a variety of forms. In one example of the preliminary image data evaluating step, a preliminary image data evaluating step can include the step of examining gray scale values of a frame of image data to determine if the image data has become saturated. If a saturation condition (sometimes referred to as a "white out" condition) is present there is a substantial likelihood of specular reflection misread or other type of misread attributable to excessive illumination. A saturated condition can be considered to be present for example if a sum total of all gray scale values exceeds a predetermined value, or if an average gray scale value exceeds a predetermined threshold white level. All pixel values may be evaluated during the preliminary evaluation step. More typically, however, a sample of pixel values comprising less than all pixel values of a frame are evaluated to speed processing. The sampling of pixels may be predetermined and/or adaptive.

The step of preliminarily evaluating image data to determine whether decoding will be successful can also include the step of estimating a module-to-target distance. If an estimated module-to-target distance exceeds a best focus distance by a threshold amount (which may be a predetermined threshold), control circuit 140 may preliminarily determine that decoding will likely not be successful without actually subjecting image data of a frame to a decode attempt. A method for generating a signal that varies with module to target distance is described in commonly assigned U.S. Pat. No. 5,773,810, entitled "Method of Generating Real Time Degree of Focus Signal For Hand Held Imaging Device," incorporated herein by reference.

Referring to the operating method described with reference to FIG. 4*c* in further detail, a number of different methods may be utilized to execute block 456 (combining the first and second frame of image data).

In one method for combining a first frame and a second frame of image data, cross correlation image combination methods can be utilized. In a cross correlation image combination method statistical analyses are executed to compare two or more frames of image data and frames of image data are shifted relative to one another until correlation is optimized.

Figure 4D:
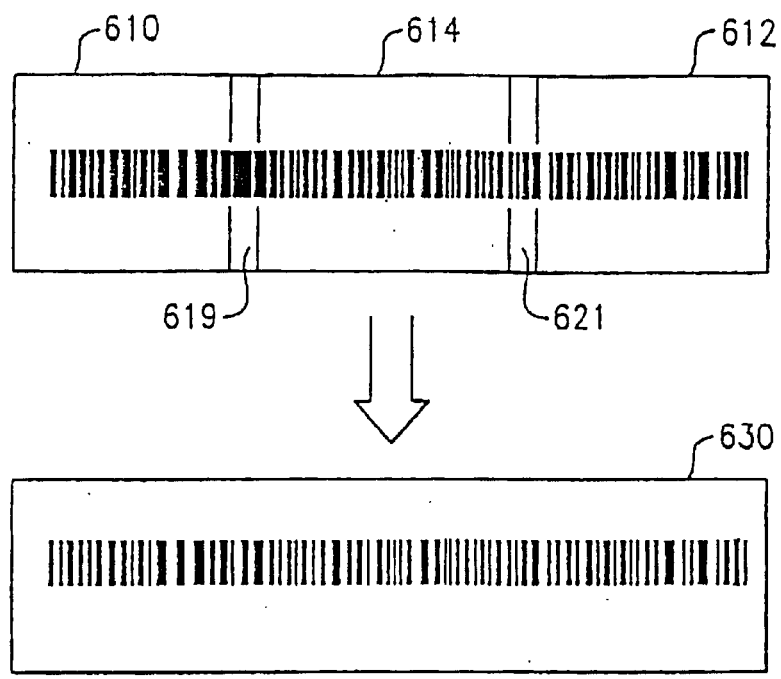
FIGS. 4d–4e are image frame diagrams illustrating various image combination methods which may be incorporated in a multiple imaging module reader according to the invention.

In another method for combining first and second frames of image data, areas of overlap between two frames of image data e.g. 610, 614 are determined and then the image data contribution from one of the frames corresponding to the overlapping area is deleted or modified in a manner depending on the overlapping region image data of the other frame to generate a third image representation 630. In the example of FIG. 4*d*, showing first, second, and third frames of image data 610, 612, and 614, overlapping regions 619 and 621 are defined between the first and third frames 610 and 614 and between the third and second frames 614 and 612. Overlapping regions of image data 619, 621 are regions e.g. of image data from two separate frames of image data that correspond to a common region of a target substrate, s.

The area of overlap between frames of image data captured via actuation of the image sensors of neighboring imaging modules can be determined based on known characteristics of the neighboring imaging modules 10 of reader 5, such as the spacing between imaging modules of reader 5 (e.g. modules 10a and 10c of reader 5-3), power of imaging optics 40 of the particular imaging module 10, and the respective module-to-target distances of the neighboring modules. A distance of a module to a target can be estimated via analysis of captured image data, for example by a method for developing a degree of focus signal as is described in commonly assigned U.S. Pat. No. 5,773,810, entitled "Method For Generating Real Time Degree of Focus Signal For Hand Held Imaging Device," incorporated herein by reference. It can be seen that the image frame diagram of FIG. 4d may correspond to parallel-axis reader 5-3 as shown in FIG. 1e having a plurality of imaging modules comprising parallel imaging axes while the image frame diagram of FIG. 4e (wherein frames 652 and 654 are distorted) may correspond to the diverging axis three module reader 5-4 as shown in FIGS. 1g and 1h.

Figure 4E:
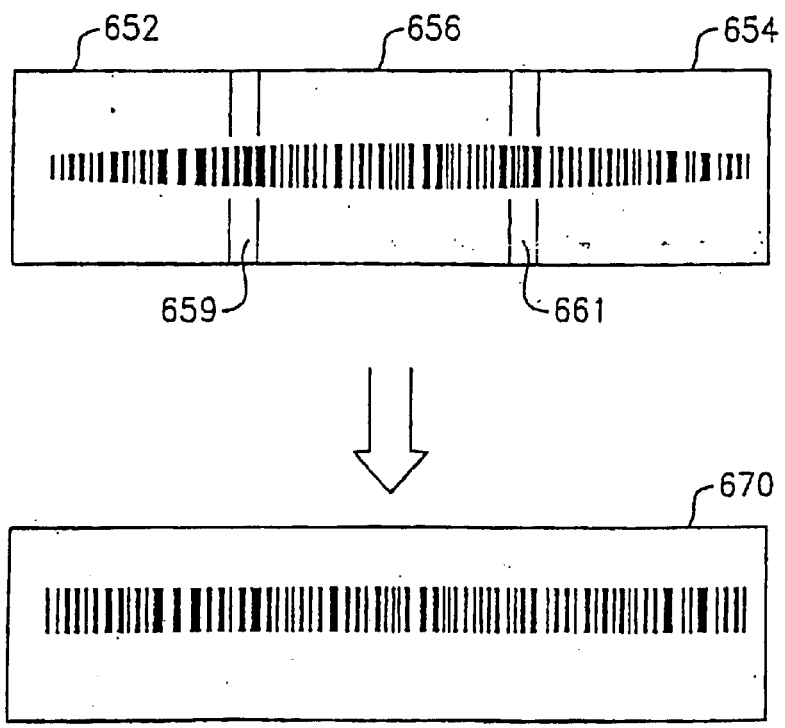

Referring to the frame diagram of FIG. 4e in further detail, overlapping regions 659 and 661 are defined between first frame 652 and third frame 656 and between third frame 656 and second frame 654. When combining two frames of image data in the example of FIG. 4e, it is particularly important to correct for skew errors (sometimes referred to as distortion errors) when combining frames of image data and when calculating regions of overlap between two frames of image data. In the example of FIG. 4e, skew errors can readily be corrected for by, in part, utilizing a skew correction factor determined from the known relative angles between two imaging axes of a multiple module reader such axes 11a and 11c of reader 5-4, and the spacing between modules of a multiple module reader such as reader 54. Further skew correction of a frame of image data can be carried out in a manner described in copending application Ser. No. 09/954,081, filed Sep. 17, 2001, entitled "Imaging Device Having Indicia-Controlled Image Parsing Mode," incorporated herein by reference. In that application, a method is described wherein graphical analysis and interpolation processing are employed to determine a distortion factor affecting a frame of image data, and further wherein the determined distortion factor is utilized to back out distortion from an image.

Still further, graphical feature analysis can be utilized in combining frames of image data. If a common graphical feature (e.g. a straight line, a bulls eye, a circle, a character) is found in two frames of image data, the common graphical feature can be utilized to establish a common orientation, spacing, and skew basis between the frames of image data to be combined.

While the present invention has been explained with reference to the structure disclosed herein, it is not confined to the details set forth and this invention is intended to cover any modifications and changes as may come within the scope of the following claims.

We claim:

1. An optical reader comprising:
   a portable housing;
   a first imaging module having a first imaging axis;
   a second imaging module having a second imaging axis, wherein said first and second imaging modules are disposed so that said first and second imaging axes converge toward one another;
   wherein each of said first and second imaging modules include an image sensor having an array of photosensitive elements, a support assembly, and at least one illumination LED;
   a control circuit in communication with each of said first and second imaging modules;
   wherein said first and second imaging modules are encapsulated in said first portable gun style housing, and
   wherein said control circuit is programmed, in response to receipt of a trigger signal to:
      (a) capture a first frame of image data via actuation of said illumination LED and said image sensor of said first imaging module;
      (b) determine whether said first frame of image data includes decodable indicia;
      (c) automatically subjects to a decode attempt a second frame of image data if said determination step (b) indicates that decodable indicia is not or is likely not represented in said first frame, wherein said second frame of image data is captured via actuation of said at least one LED of said second imaging module and said image sensor of said first imaging module, wherein no illumination LED of said first imaging module is actuated when said second frame of image data is captured.

2. The reader of claim 1, wherein said control circuit in determining whether decodable indicia is represented in said first frame of image data attempts to decode decodable indicia represented in said first frame of image data.

3. The reader of claim 1, wherein said control circuit captures said second frame of image data contemporaneously while capturing said first frame of image data.

4. The reader of claim 1, wherein said control circuit in determining whether decodable indicia is represented in said first frame of image data preliminarily evaluates image data of said first frame without attempting to decode decodable indicia represented therein.

5. The reader of claim 1, wherein said control circuit in preliminarily evaluating said image data evaluates said image data to determine whether a saturation condition is present.

6. The reader of claim 1, wherein said first imaging module is a 1D imaging module and wherein said second imaging module is a 2D imaging module.

7. The reader of claim 1, wherein said first and second imaging modules are configured to have first and second best focus distances, wherein, said first best focus distance is at least 1 inch apart from said second best focus distance.

8. The reader of claim 1, wherein said trigger signal is an automatically generated trigger signal generated by decodable indicia being moved in a field of view of said reader.

9. The reader of claim 1, further comprising a trigger, wherein said trigger signal is generated when said trigger is pulled.

10. The reader of claim 1, wherein said first portable housing is a gun-style housing.

11. The optical reader of claim 1, wherein said first and second imaging modules are configured to have first and second fixed best focus distances, and wherein said first fixed best focus distance is at least one inch apart from said second fixed best focus distance.

12. The optical reader of claim 1, wherein said control circuit further in response to a receipt of a trigger signal, disables all LEDs of said first imaging module during a frame exposure period for said second frame of image data.

13. A method for reducing specular reflection read errors in an optical reader that is responsive to a trigger signal, said method comprising the steps of:
   (a) disposing in a common housing first and second electro-optical imaging assemblies in spaced apart relation, each of said first and second electro-optical imaging assemblies having a solid state area image sensor comprising a plurality of rows and plurality of columns of photosensitive picture elements, each electro-optical imaging assembly further having an illumination assembly that projects an illumination pattern which spans a two dimensional area, (b) actuating said trigger to initiate a bar code read session, said bar code read session comprising the steps of (i) capturing a first frame of image data including a plurality of pixel values, said first frame of image data being captured via actuation of said solid state area image sensor of said first electro-optical imaging assembly and said illumination assembly of said first electro-optical imaging assembly;

(ii) capturing a second frame of image data including a plurality of pixel values, said second frame of image data being captured via actuation of said solid state image sensor of said first electro-optical imaging assembly and said illumination assembly of said second electro-optical imaging assembly, wherein said illumination assembly of said first electro-optical assembly is controlled so that said illumination assembly of said first imaging assembly is disabled during an exposure period for said second frame of image data;

(iii) attempting to decode a decodable indicia represented in said first frame of image data captured in step (i);

(iv) attempting to decode a decodable indicia represented in said second frame of image data captured in step (ii); and (v) outputting a decoded message if one of said decoding steps (iii) or (iv) is successful.

14. The method of claim 13, wherein said first frame and said second frame of image data each includes a plurality of gray scale pixel values.

15. The method of claim 13, wherein said disposing step includes the step of disposing said electro-optical assemblies in vertical orientation relative to one another.

16. The method of claim 13, wherein said disposing step includes the step of disposing said electro-optical assemblies in horizontal orientation relative to one another.

17. The method of claim 13, wherein said disposing step includes the step of disposing said first and second electro-optical imaging assemblies in a common hand held housing.

18. The method of claim 13, wherein said disposing step includes the step of disposing said first and second electro-optical assemblies in such relation that imaging axes of said first and second electro-optical assemblies diverge.

19. The method of claim 13, wherein said disposing step includes the step of disposing said first and second electro-optical assemblies in such relation that imaging axes of said first and second electro-optical assemblies converge.

20. The method of claim 13, wherein said disposing step includes the step of disposing said first and second electro-optical assemblies in such relation that imaging axes of said first and second electro-optical assemblies are substantially parallel.

21. The method of claim 13, further including the step of configuring said fist and second electro-optical assemblies to have first and second respective fixed best focus distances that are at least one inch apart.

22. A bar code reading device configured for reduction of specular reflection read errors, said bar code reader comprising:

(a) a first electro-optical assembly having a first solid state image sensor and a first illumination assembly;

(b) a second electro-optical assembly having a second solid state image sensor and a second illumination assembly, said second electro-optical assembly being spaced apart from said first electro-optical assembly;

(c) wherein said first and second electro-optical assemblies each has a fixed best focus position, and wherein a best focus position of said first electro-optical assembly differs from a best focus position of said second electro-optical assembly by at least 1 inch;

(d) a control circuit coupled to both of said first electro-optical assembly and said second electro-optical assembly, (e) wherein said control circuit while actuating said first illumination assembly to project an area illumination pattern captures a first frame of image data via actuation of said first image sensor;

(f) wherein said control circuit while actuating said second illumination assembly to project an illumination pattern captures a second frame of image data via actuation of said first image sensor;

(g) wherein said control circuit during an exposure period for said second frame of image data, disables said first illumination assembly so that light from said first illumination assembly does not affect amplitudes of pixel values that make up said second frame of image data; and (h) wherein said control circuit attempts to decode decodable indicia represented by at least one of said first frame or said second frame of image data.

23. The bar code reading device of claim 22, further comprising a hand held housing supporting said first and second electro-optical assemblies.

24. The bar code reading device of claim 22, wherein said control circuit is configured to preliminarily evaluate said first frame of image data in order to determine whether to attempt to decode said second frame of image data.

25. The bar code reading device of claim 22, wherein said bar code reading device is configured so that said control circuit operates in accordance with elements (e), (f), (g), and (h) when receiving a trigger actuation signal.

26. The bar code reading device of claim 22, further comprising a trigger, wherein said bar code reading device is configured so that said control circuit operates in accordance with elements (e), (f), (g), and (h) when said trigger is actuated.

27. The bar code reading device of claim 22, further comprising a hand held housing, wherein said first and second electro-optical assemblies are disposed vertically relative to one another within said hand held housing.

28. The bar code reading device of claim 22, further comprising a hand held housing, wherein said first and second electro-optical assemblies are disposed horizontally relative to one another within said hand held housing.

29. The bar code reading device of claim 22, wherein said first and second electro-optical assemblies include first and second imaging axes, and wherein said first and second electro-optical assemblies are disposed so that said first and second imaging axes diverge.

30. The bar code reading claim 22, wherein said first first and second electro-optical assemblies include first and second imaging axes, and wherein said first and second electro-optical assemblies are disposed so that said first and second imaging axes converge.

31. The bar code reading device of claim 22, wherein said first and second electro-optical assemblies include first and second imaging axes, and wherein said first and second electro-optical assemblies are disposed so that said first and second imaging axes are substantially parallel to one another.

32. A data collection device comprising:
(a) a housing;
(b) a first imaging module disposed in said housing comprising a first solid state image sensor and at least one illumination LED;
(c) a second imaging module also disposed in said housing spaced apart from said first imaging module and including a second solid state image sensor, said second imaging module also including at least one illumination LED;
(d) a trigger;
(e) a control circuit in communication with each of said first and second imaging modules, wherein said control circuit is configured to capture image data either by actuation of said first image sensor or by actuation of said second image sensor;
(f) wherein at least one of said first solid state image sensor or said second solid state image sensor is an area solid state image sensor having a plurality of rows, and a plurality of columns, of photosensitive picture elements;
(g) wherein said control circuit, in response to an actuation of said trigger captures a first frame of image data during a first frame capture period, said first frame of image data being captured via actuation of said first solid state image sensor and said at least one illumination LED;
(h) wherein said control circuit further in response to said trigger being actuated captures a second frame of image data, said second frame of image data being captured via actuation of said first image sensor and said at least one illumination LED of said second imaging module, wherein said control circuit controls said at least one LED of said first imaging module so that amplitudes of pixel values of said second frame of image data are not affected by said at least one illumination LED of said first imaging module; and
(i) wherein said control circuit further in response to said trigger being actuated attempts to decode decodable indicia represented in at least one of said first or second frames of image data.

33. The data collection device of claim 32, wherein each of said first and second imaging modules includes a plurality of LEDs.

34. The data collection device of claim 32, wherein each of said first and second imaging modules further includes an aiming pattern generator.

35. The data collection device of claim 32, wherein each of said first and second imaging modules projects an illumination pattern that spans a two dimensional area.

36. The data collection device of claim 32, wherein each of said first and second imaging modules projects an illumination pattern that spans a two dimensional area that encompasses a field of view of its respective imaging module.

37. The data collection device of claim 32, wherein each of said first and second imaging modules have best focus distances that are fixed and not equal to one another.

38. The data collection device of claim 32, wherein said control circuit is configured to preliminarily evaluate said first frame of image data in order to determine whether to attempt to decode said second frame of image data.

39. The data collection device of claim 32, wherein said first and second imaging modules are disposed vertically relative to one another within said housing.

40. The data collection device of claim 32, wherein said first and second imaging modules are disposed horizontally relative to one another within said housing.

41. The data collection device of claim 32, wherein said first and second imaging modules include first and second imaging axes, and wherein said first and second modules are disposed so that said first and second imaging axes diverge.

42. The data collection device of claim 32, wherein said first and second imaging modules include first and second imaging axes, and wherein said first and second modules are disposed so that said first and second imaging axes converge.

43. The data collection device of claim 32, wherein said first and second imaging modules include first and second imaging axes, and wherein said first and second imaging modules are disposed so that said first and second imaging axes are substantially parallel to one another.

44. A data collection device comprising:
(a) a housing;
(b) a first imaging module disposed in said housing comprising a first solid state image sensor and an illumination assembly including light diffusing optics and at least one illumination light source;
(c) a second imaging module also disposed in said housing adjacent relative to said first imaging module and including a second solid state image sensor, said second imaging module also comprising an illumination assembly including light diffusing optics and at least one illumination light source;
(d) a control circuit in communication with each of said first and second imaging modules, wherein said control circuit is configured to capture image data either via actuation of said first image sensor or via actuation of said second image sensor;
(e) wherein at least one of said first solid state image sensor and said second solid state image sensor is an area solid state image sensor having an plurality of rows, and a plurality of columns, of photosensitive picture elements;
(f) wherein said control circuit, in response to receipt of a trigger signal captures a frame of image data, said frame of image data being captured via actuation of said first solid state image sensor and said at least one illumination light source of said second imaging module, wherein said control circuit controls said at least one light source of said first imaging module so that image signals processed to develop said frame of image data are not affected by said at least one illumination light source of said first imaging module; and
(g) wherein said control circuit further in response to receipt of said trigger signal attempts to decode decodable indicia represented in said frame of image data.

45. The data collection device of claim 44, wherein each of said first and second imaging modules includes a plurality of LEDs.

46. The data collection device of claim 44, wherein each of said first and second imaging modules further including an aiming pattern generator.

47. The data collection device of claim 44, wherein each of said first and second imaging modules projects an illumination pattern that spans a two dimensional area.

48. The data collection device of claim 44, wherein each of said first and second imaging modules projects an illumination pattern that spans a two dimensional area that encompasses a field of view of its respective imaging module.

49. The data collection device of claim 44, wherein each of said first and second imaging modules have best focus distances that are fixed and not equal to one another.

50. The data collection device of claim 44, wherein said control circuit is configured to preliminarily evaluate said first frame of image data in order to determine whether to attempt to decode said second frame of image data.

51. The data collection device of claim 44, wherein said first and second imaging modules are disposed vertically relative to one another within said housing.

52. The data collection device of claim 44, wherein said first and second imaging modules are disposed horizontally relative to one another within said housing.

53. The data collection device of claim 44, wherein said first and second imaging modules include first and second imaging axes, and wherein said first and second imaging modules are disposed so that said first and second imaging axes diverge.

54. The data collection device of claim 44, wherein said first and second imaging modules include first and second imaging axes, and wherein said first and second imaging modules are disposed so that said first and second imaging axes converge.

55. The data collection device of claim 44, wherein said first and second imaging modules include first and second imaging axes, and wherein said first and second imaging modules are disposed so that said first and second imaging axes are substantially parallel to one another.

56. The data collection device of claim 44, wherein said first and second imaging modules are spaced apart.

57. The data collection device of claim 44, wherein said data collection device includes a manual trigger, and wherein said device is configured so that said control circuit receives said trigger signal when said manual trigger is actuated.

58. The data collection device of claim 44, wherein said data collection device is configured so that said data collection device receives said trigger signal automatically in response to an object being presented to said device.

59. The data collection device of claim 44, wherein said data collection device is configured so that said data collection device receives said trigger signal automatically in response to a decodable indicia being presented to a field of view of said device.

60. The data collection device of claim 44, wherein said data collection device is a fixed position presentation device.

61. The data collection device of claim 44, wherein said data collection device is a fixed position presentation device, and wherein said data collection device is configured so that said data collection device receives said trigger signal automatically in response to an object being presented to said device.

62. The data collection device of claim 44, wherein said housing is a hand held housing.

63. The data collection device of claim 44, wherein said first solid state image sensor is a dimensional solid state image sensor and said second solid state image sensor is an area solid state image sensor.

64. The data collection device of claim 44, wherein said first solid state image sensor is a one dimensional solid state image sensor and said second solid state image sensor is a one dimensional solid state image sensor.

65. The data collection device of claim 44, wherein at least one of said first and second imaging modules are modularly installed self contained units that are assembled into packaged form prior to being disposed in said housing.

\* \* \* \* \*

UNITED STATES PATENT AND TRADEMARK OFFICE
CERTIFICATE OF CORRECTION

PATENT NO. : 7,219,843 B2  Page 1 of 1
APPLICATION NO. : 10/453796
DATED : May 22, 2007
INVENTOR(S) : William H. Havens et al.

It is certified that error appears in the above-identified patent and that said Letters Patent is hereby corrected as shown below:

On page 3, U.S. Patents:

Add --6,178,426 B1 1/2001 Klein et al.--.

Delete "6,188,404 B1 2/2001 Rekimoto" and replace with --6,186,404 B1 2/2001 Ehrhart et al.--.

Column 3, line 16, change "1$a$-1$n$" to --1$a$-1$o$--.

Column 3, line 18, change "1$o$" to --1$p$--.

Column 4, line 17, change "can can" to --can--.

Column 4, line 22, change "configured to" to --configured so--.

Column 4, line 23, change "illuminating" to --illumination--.

Column 4, line 29, change "filed" to --field--.

Column 15, line 52, change "FIG." to --FIGS.--.

Column 24, line 57, change "reading claim" to --reading device of claim--.

Column 24, line 57, change "first first" to --first--.

Column 28, line 20, change "a dimensional" to --a one dimensional--.

Signed and Sealed this

Twenty-first Day of August, 2007

JON W. DUDAS
*Director of the United States Patent and Trademark Office*